(12) United States Patent
Sakakibara et al.

(10) Patent No.: US 9,229,323 B2
(45) Date of Patent: Jan. 5, 2016

(54) PATTERN-FORMING METHOD

(71) Applicant: JSR CORPORATION, Tokyo (JP)

(72) Inventors: Hirokazu Sakakibara, Tokyo (JP); Hiromu Miyata, Tokyo (JP); Taiichi Furukawa, Tokyo (JP); Koji Ito, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/281,738

(22) Filed: May 19, 2014

(65) Prior Publication Data

US 2014/0255854 A1 Sep. 11, 2014

Related U.S. Application Data

(60) Division of application No. 13/955,435, filed on Jul. 31, 2013, now abandoned, which is a continuation of application No. PCT/JP2012/051711, filed on Jan. 26, 2012.

(30) Foreign Application Priority Data

Feb. 4, 2011 (JP) .................................. 2011-023384

(51) Int. Cl.
  *G03F 7/038* (2006.01)
  *G03F 7/30* (2006.01)
  *G03F 7/004* (2006.01)
  *C08F 220/18* (2006.01)
  *C08F 220/28* (2006.01)
  *C08F 224/00* (2006.01)
  *G03F 7/039* (2006.01)
  *G03F 7/11* (2006.01)
  *G03F 7/20* (2006.01)
  *G03F 7/32* (2006.01)
  *C08F 220/38* (2006.01)

(52) U.S. Cl.
  CPC ............. *G03F 7/038* (2013.01); *C08F 220/18* (2013.01); *C08F 220/28* (2013.01); *C08F 224/00* (2013.01); *G03F 7/004* (2013.01); *G03F 7/0046* (2013.01); *G03F 7/0397* (2013.01); *G03F 7/11* (2013.01); *G03F 7/2041* (2013.01); *G03F 7/325* (2013.01); *C08F 2220/283* (2013.01); *C08F 2220/382* (2013.01)

(58) Field of Classification Search
  None
  See application file for complete search history.

(56) References Cited

U.S. PATENT DOCUMENTS

| | | | |
|---|---|---|---|
| 4,491,628 A | 1/1985 | Ito et al. | |
| 4,910,122 A | 3/1990 | Arnold et al. | |
| 5,744,537 A | 4/1998 | Brumsvold et al. | |
| 2005/0277059 A1 | 12/2005 | Kanda | |
| 2006/0183348 A1 | 8/2006 | Meagley et al. | |
| 2008/0193879 A1 | 8/2008 | Allen et al. | |
| 2009/0202945 A1 | 8/2009 | Nakagawa et al. | |
| 2011/0151378 A1 | 6/2011 | Matsumura et al. | |

FOREIGN PATENT DOCUMENTS

| | | |
|---|---|---|
| EP | 2325694 | 5/2001 |
| JP | 59-45439 | 3/1984 |
| JP | 06-12452 | 5/1984 |
| JP | 59-93448 | 5/1984 |
| JP | 05-188598 | 7/1993 |
| JP | 2000-199953 | 7/2000 |
| JP | 2005-352384 | 12/2005 |
| JP | 2008-304773 A | 12/2008 |
| JP | 2009-025707 | 2/2009 |
| JP | 2009-134088 | 6/2009 |

(Continued)

OTHER PUBLICATIONS

International Search Report or corresponding International Application No. PCT/JP2012/051711, Mar. 6, 2012.

(Continued)

*Primary Examiner* — Cynthia Hamilton
(74) *Attorney, Agent, or Firm* — Oblon, McClelland, Maier & Neustadt, L.L.P

(57) ABSTRACT

A pattern-forming method includes providing a resist film on a substrate using a photoresist composition. The resist film is exposed. The exposed resist film is developed using a developer having an organic solvent content of 80 mass % or more. The photoresist composition includes a first polymer, a second polymer, and an acid generator. The first polymer is a base polymer and includes a first structural unit that includes an acid-labile group. The second polymer includes a second structural unit that includes an acid-labile group, and has a fluorine atom content higher than a fluorine atom content of the first polymer. The second structural unit is represented by a formula (1) or a formula (2).

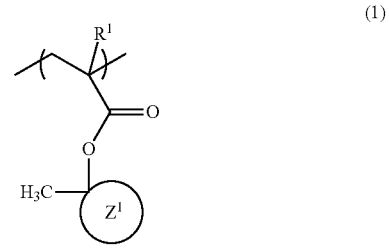

(1)

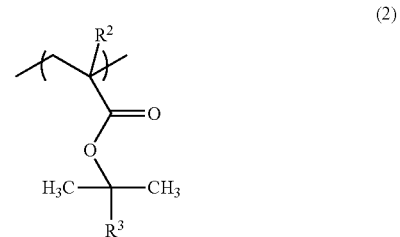

(2)

16 Claims, No Drawings

(56) References Cited

FOREIGN PATENT DOCUMENTS

| JP | 2010-33032 A | 2/2010 |
| JP | 2010-61116 A | 3/2010 |
| JP | 2011-209520 A | 10/2011 |
| JP | 2011-248019 | 12/2011 |
| WO | 2007/116664 | 10/2007 |
| WO | 2009/142181 | 11/2009 |
| WO | 2010/029982 | 3/2010 |
| WO | WO-2012/002519 a1 * | 1/2012 |

OTHER PUBLICATIONS

English translation of JP 2009-025707, A (2009) from machine translation for AIPN Japan Patent Office National Center for Industrial Property Information and Training generated Sep. 29, 2013, 49 pages and 44 pages.

English translation of JP 2011-248019, A (2011) from machine translation for AIPN Japan Patent Office National Center for Industrial Property Information and Training generated Sep. 29, 2013, 64 pages and 14 pages.

U.S. Appl. No. 14/640,882, filed Mar. 6, 2015, Sakakibara, et al.

Office Action issued Mar. 3, 2015 in Japanese Patent Application No. 2012-555828 (with English language translation).

Office Action issued Jun. 9, 2015, in Taiwan Patent Application No. 101103517 filed Feb. 3, 2012 (w/ English translation).

Office Action issued Sep. 8, 2015, in Japanese Patent Application No. 2012-555828 (w/ English translation).

* cited by examiner

PATTERN-FORMING METHOD

CROSS-REFERENCE TO RELATED APPLICATIONS

The present application is a divisional application of the U.S. patent application Ser. No. 13/955,435 filed Jul. 31, 2013, which in turn is a continuation application of International Application No. PCT/JP2012/051711, filed Jan. 26, 2012, which claims priority to Japanese Patent Application No. 2011-023384, filed Feb. 4, 2011. The contents of these applications are incorporated herein by reference in their entirety.

BACKGROUND OF THE INVENTION

1. Field of the Invention

The present invention relates to a pattern-forming method.

2. Discussion of the Background

A reduction in dimensions of a resist pattern used for a lithographic process has been desired along with miniaturization of various electronic device (e.g., semiconductor device and liquid crystal device) structures. An ArF excimer laser has typically been used as a short-wavelength light source. A fine resist pattern having a line width of about 90 nm can be formed using ArF excimer laser light. Various resist compositions that can deal with such a short-wavelength light source have been studied. For example, a photoresist composition has been known that includes an acid generator component that generates an acid upon exposure, and a resin component that changes in solubility in a developer due to the acid generated by the acid generator component, and is designed so that a difference in solubility rate occurs between the exposed area and the unexposed area to form a resist pattern on a substrate (see Japanese Patent Application Publication (KOKAI) No. 59-45439).

As a technique that improves the resolution of the photoresist composition using an existing system without increasing the number of steps, a pattern-forming method has been known that utilizes an organic solvent having a polarity lower than that of an alkaline aqueous solution as the developer (see Japanese Patent Application Publication (KOKAI) No. 2000-199953). According to the above pattern-forming method, the optical contrast can be improved by utilizing an organic solvent as the developer instead of an alkaline aqueous solution, and a finer pattern can be formed.

SUMMARY OF THE INVENTION

According to one aspect of the present invention, a pattern-forming method includes providing a resist film on a substrate using a photoresist composition. The resist film is exposed. The exposed resist film is developed using a developer having an organic solvent content of 80 mass % or more. The photoresist composition includes a first polymer, a second polymer, and an acid generator. The first polymer is a base polymer and includes a first structural unit that includes an acid-labile group. The second polymer includes a second structural unit that includes an acid-labile group, and has a fluorine atom content higher than a fluorine atom content of the first polymer. The second structural unit is represented by a formula (1) or a formula (2).

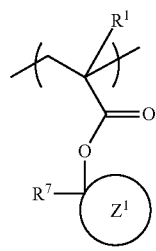
(1)

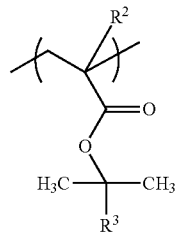
(2)

$R^1$ is a hydrogen atom, a fluorine atom, a methyl group, or a trifluoromethyl group; $Z^1$ is a divalent monocyclic hydrocarbon group having 5 or 6 carbon atoms or a divalent polycyclic hydrocarbon group having 7 to 10 carbon atoms; $R^2$ is a hydrogen atom, a fluorine atom, a methyl group, or a trifluoromethyl group; and $R^3$ is an alicyclic hydrocarbon group having 5 to 20 carbon atoms. A content of the second polymer is 0.5 to 10 parts by mass based on 100 parts by mass of the first polymer.

DESCRIPTION OF THE EMBODIMENTS

According to one embodiment of the invention, a photoresist composition that is developed using an organic solvent includes:

[A] a base polymer that includes a structural unit (a1) that includes an acid-labile group (hereinafter may be referred to as "polymer [A]");

[B] a polymer that includes a structural unit (b1) that includes an acid-labile group, and has a fluorine atom content higher than that of the polymer [A] (hereinafter may be referred to as "fluorine-containing polymer [B]"); and

[C] an acid generator, the structural unit (b1) being represented by a formula (1) or (2),

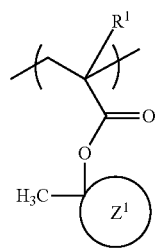
(1)

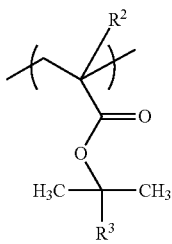

(2)

wherein R¹ is a hydrogen atom, a fluorine atom, a methyl group, or a trifluoromethyl group, Z¹ is a divalent monocyclic hydrocarbon group having 5 or 6 carbon atoms or a divalent polycyclic hydrocarbon group having 7 to 10 carbon atoms, R² is a hydrogen atom, a fluorine atom, a methyl group, or a trifluoromethyl group, and R³ is an alicyclic hydrocarbon group having 5 to 20 carbon atoms.

The fluorine-containing polymer [B] (water-repellent resin) included in the photoresist composition includes the structural unit (b1) that is represented by the formula (1) or (2). The acid-labile group having the above specific structure that is included in the fluorine-containing polymer [B] does not easily dissociate due to an acid as compared with the acid-labile group that is included in the polymer [A]. Therefore, the solubility of the photoresist composition in a developer that includes an organic solvent is moderately controlled in each of the exposed area and the unexposed area, and the photoresist composition can suppress occurrence of a missing contact hole and roughness on the surface of the exposed area after development. The photoresist composition also exhibits excellent lithographic performance (e.g., resolution and circularity).

It is preferable that the structural unit (a1) be a structural unit represented by a formula (3) or (4),

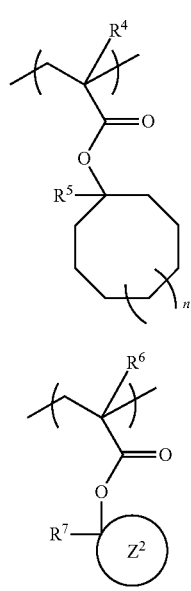

(3)

(4)

wherein R⁴ is a hydrogen atom, a fluorine atom, a methyl group, or a trifluoromethyl group, R⁵ is an alkyl group having 1 to 5 carbon atoms, n is 0 or 1, R⁶ is a hydrogen atom, a fluorine atom, a methyl group, or a trifluoromethyl group, R⁷ is an alkyl group having 2 to 5 carbon atoms, and Z² is a divalent monocyclic hydrocarbon group having 5 or 6 carbon atoms or a divalent polycyclic hydrocarbon group having 7 to 15 carbon atoms.

When the polymer [A] (base polymer) included in the photoresist composition includes the acid-labile group represented by the formula (3) or (4) that easily dissociates due to an acid, the solubility of the photoresist composition in a developer that includes an organic solvent decreases in the exposed area, and roughness on the surface of the exposed area after development is further suppressed. When the fluorine-containing polymer [B] includes the acid-labile group having the above specific structure that does not easily dissociate due to an acid, and the polymer [A] includes the acid-labile group having the above specific structure that easily dissociates due to an acid, the solubility of the photoresist composition in a developer that includes an organic solvent decreases in the exposed area, and becomes moderate in the unexposed area. As a result, the photoresist composition can advantageously suppress occurrence of a missing contact hole and roughness on the surface of the exposed area after development. The photoresist composition also exhibits more excellent lithographic performance (e.g., resolution and circularity).

It is preferable that the fluorine-containing polymer [B] further include a structural unit (b2) represented by a formula (5),

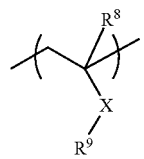

(5)

wherein R⁸ is a hydrogen atom, a fluorine atom, a methyl group, or a trifluoromethyl group, X is a linking group, and R⁹ is a linear or branched alkyl group having 1 to 10 carbon atoms or an alicyclic hydrocarbon group having 4 to 20 carbon atoms, provided that some or all of the hydrogen atoms of the alkyl group or the alicyclic hydrocarbon group are substituted with a substituent, at least one substituent that substitutes some or all of the hydrogen atoms of the alkyl group or the alicyclic hydrocarbon group being a fluorine atom.

When the fluorine-containing polymer [B] further includes the structural unit (b2) having the above specific structure that includes a fluorine atom, the photoresist composition can increase the contact angle of the surface of the resist film, and may suitably be used for liquid immersion lithography.

The photoresist composition according to the embodiment of the invention may be used for a pattern-forming method that utilizes an organic solvent as the developer, and exhibits excellent lithographic performance (e.g., resolution and circularity) while suppressing occurrence of a missing contact hole and roughness on the surface of the exposed area after development. Therefore, the photoresist composition is sufficient to meet the demands of various electronic device (e.g., semiconductor device or liquid crystal device) structures that are expected to be further miniaturized in the future. The embodiments will now be described in detail.

Photoresist Composition

A photoresist composition according to one embodiment of the invention is developed using an organic solvent, and includes the polymer [A], the fluorine-containing polymer [B], and the acid generator [C]. Note that the photoresist composition may further include an optional component as long as the advantageous effects of the invention are not impaired. Each component is described in detail below.

Polymer [A]

The polymer [A] is a base polymer that includes the structural unit (a1) that includes an acid-labile group. The term "base polymer" used herein refers to a polymer that mainly forms a resist pattern that is formed using the photoresist composition, and preferably accounts for 50 mass % or more of the total polymers that form the resist pattern. The term "acid-labile group" used herein refers to a group that substitutes a hydrogen atom of a polar functional group (e.g., carboxyl group), and dissociates due to an acid generated by the acid generator [C] upon exposure.

The structural unit (a1) is not particularly limited as long as the structural unit (a1) includes an acid-labile group that is normally included in a base polymer. The structural unit (a1) is preferably the structural unit represented by the formula (3) or (4). When the structural unit (a1) includes the acid-labile group having the above specific structure that easily dissociates due to an acid, the solubility of the photoresist composition in a developer that includes an organic solvent decreases in the exposed area, and roughness on the surface of the exposed area after development can be further reduced. Note that the polymer [A] may include a structural unit (a2) that includes a lactone structure, a sultone structure, or a cyclic carbonate structure, a structural unit (a3) that includes a polar group, an additional structural unit (a4) that includes an acid-labile group, and the like in addition to the structural unit (a1) as long as the advantageous effects of the invention are not impaired. Each structural unit is described in detail below.

Structural Unit (a1)

The structural unit (a1) is preferably a structural unit represented by the formula (3) or (4).

In the formula (3), $R^4$ is a hydrogen atom, a fluorine atom, a methyl group, or a trifluoromethyl group, $R^5$ is an alkyl group having 1 to 5 carbon atoms, and n is 0 or 1.

Examples of the alkyl group having 1 to 5 carbon atoms represented by $R^5$ include a methyl group, an ethyl group, a propyl group, a butyl group, and the like. Among these, a methyl group, an ethyl group, and a propyl group are preferable.

$R^4$ is preferably a hydrogen atom or a methyl group.

n is preferably 1.

Examples of the structural unit (a1) represented by the formula (3) include structural units represented by the following formulas (3-1) to (3-10), and the like.

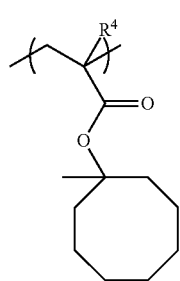
(3-1)

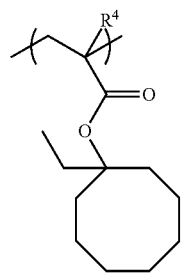
(3-2)

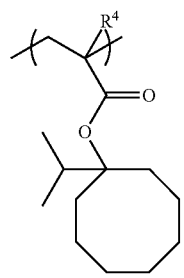
(3-3)

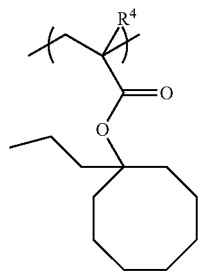
(3-4)

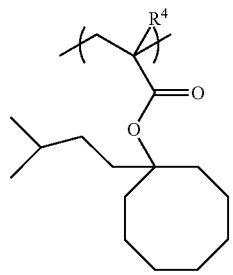
(3-5)

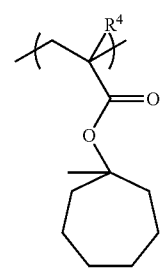
(3-6)

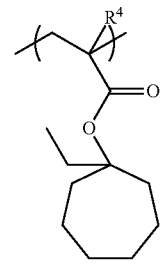
(3-7)

(3-8)
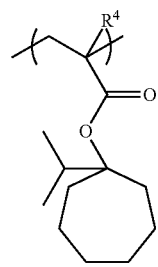

(3-9)
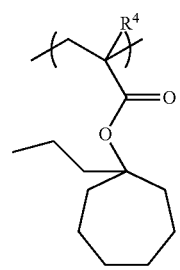

(3-10)
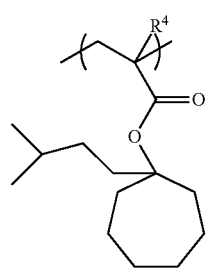

wherein R⁴ is the same as defined for the formula (3).

Among these, the structural units represented by the formulas (3-1) and (3-2) are preferable.

Examples of a preferable monomer that produces the structural unit (a1) represented by the formula (3) include the compounds represented by the following formulas, and the like.

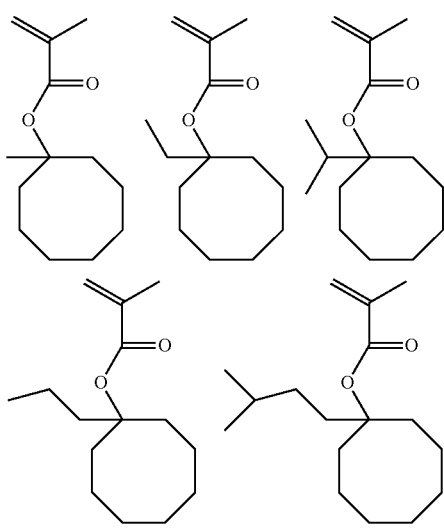

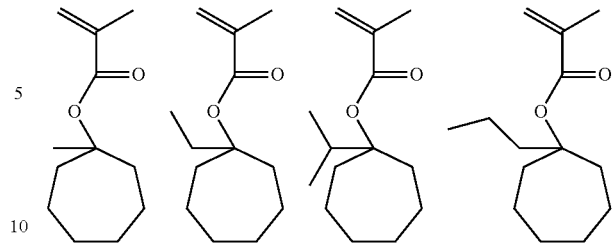

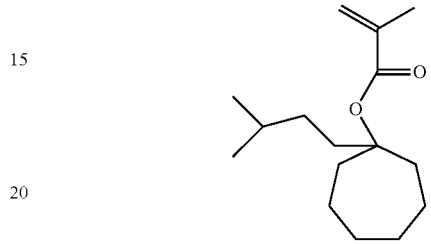

In the formula (4), $R^6$ is a hydrogen atom, a fluorine atom, a methyl group, or a trifluoromethyl group, $R^7$ is an alkyl group having 2 to 5 carbon atoms, and $Z^2$ is a divalent monocyclic hydrocarbon group having 5 or 6 carbon atoms or a divalent polycyclic hydrocarbon group having 7 to 15 carbon atoms.

Examples of the alkyl group having 2 to 5 carbon atoms represented by $R^7$ include an ethyl group, a propyl group, a butyl group, and the like. Among these, an ethyl group and a propyl group are preferable.

$R^6$ is preferably a hydrogen atom or a methyl group.

Examples of the divalent monocyclic hydrocarbon group having 5 or 6 carbon atoms represented by $Z^2$ include a cyclopentanediyl group, a cyclohexanediyl group, a cyclopentenediyl group, a cyclohexenediyl group, and the like. Among these, a cyclopentanediyl group and a cyclohexanediyl group are preferable, and a cyclopentanediyl group is more preferable.

Examples of the divalent polycyclic hydrocarbon group having 7 to 15 carbon atoms represented by $Z^2$ include a norbornanediyl group, an adamantanediyl group, a norbornenediyl group, a dinorbornanediyl group, and the like. Among these, an adamantanediyl group is preferable.

$Z^2$ is preferably a cyclopentanediyl group, a cyclohexanediyl group, or an adamantanediyl group.

Examples of the structural unit (a1) represented by the formula (4) include structural units represented by the following formulas (4-1) to (4-17), and the like.

(4-1)
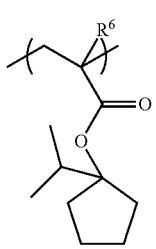

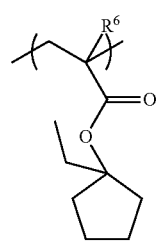 (4-2)
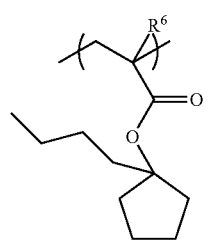 (4-3)
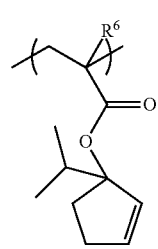 (4-4)
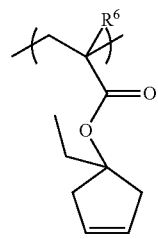 (4-5)
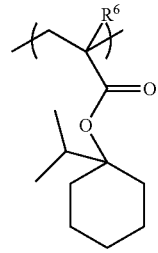 (4-6)
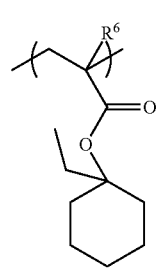 (4-7)
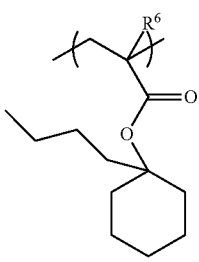 (4-8)
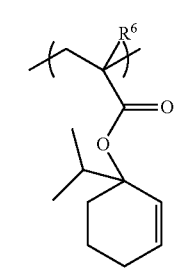 (4-9)
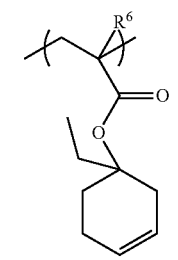 (4-10)
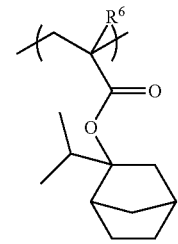 (4-11)
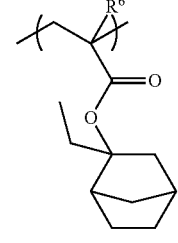 (4-12)
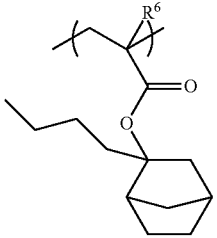 (4-13)

(4-14)
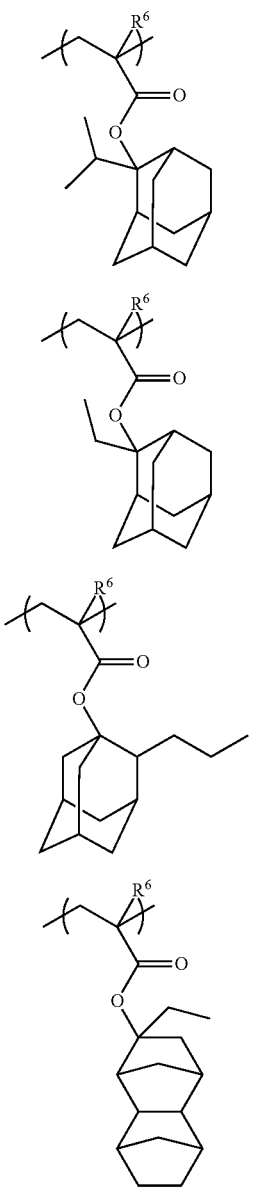
(4-15)

(4-16)

(4-17)

wherein $R^6$ is the same as defined for the formula (4).

Among these, the structural units represented by the formulas (4-1), (4-14), (4-15), and (4-17) are preferable.

Examples of a preferable monomer that produces the structural unit (a1) represented by the formula (4) include the compounds represented by the following formulas, and the like.

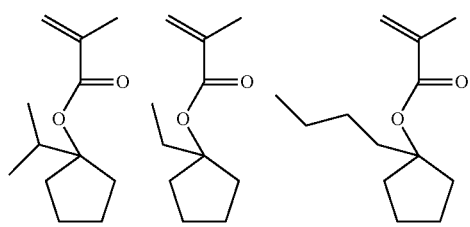

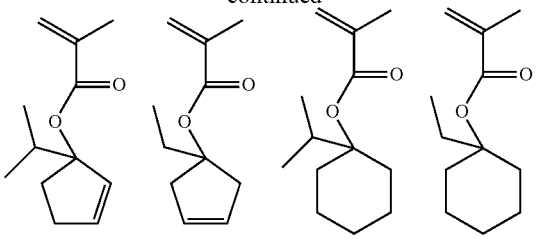
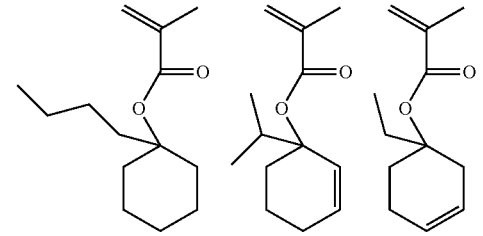
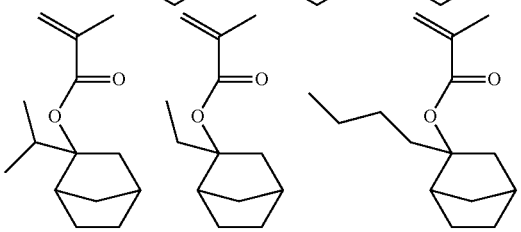
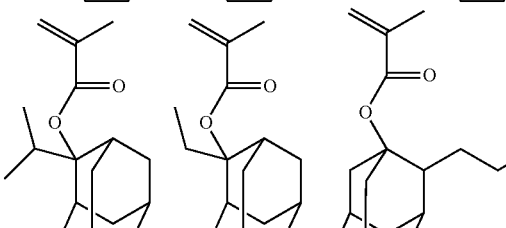
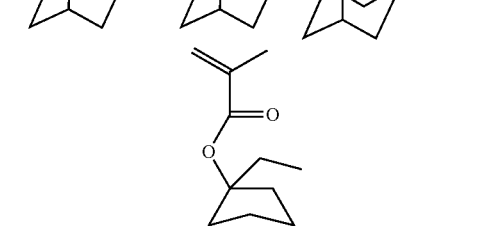
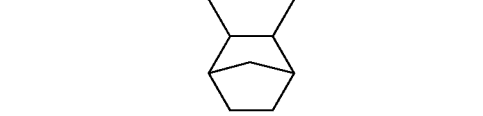

The content of the structural unit (a1) in the polymer [A] is preferably 10 to 90 mol %, more preferably 20 to 70 mol %, and still more preferably 30 to 60 mol %, based on the total structural units included in the polymer [A]. When the content of the structural unit (a1) is less than 5 mol %, the exposed area exhibits sufficient insolubility in a developer, and an excellent pattern can be obtained. The polymer [A] may include only one type of the structural unit (a1), or may include two or more types of the structural unit (a1).

Structural Unit [a2]

The polymer [A] may include the structural unit (a2) that includes a lactone structure, a sultone structure, or a cyclic carbonate structure. When the polymer [A] includes the structural unit (a2), a resist film that is formed using the photoresist composition exhibits improved adhesion to a substrate and the like.

Examples of the structural unit (a2) include structural units represented by the following formulas, and the like.

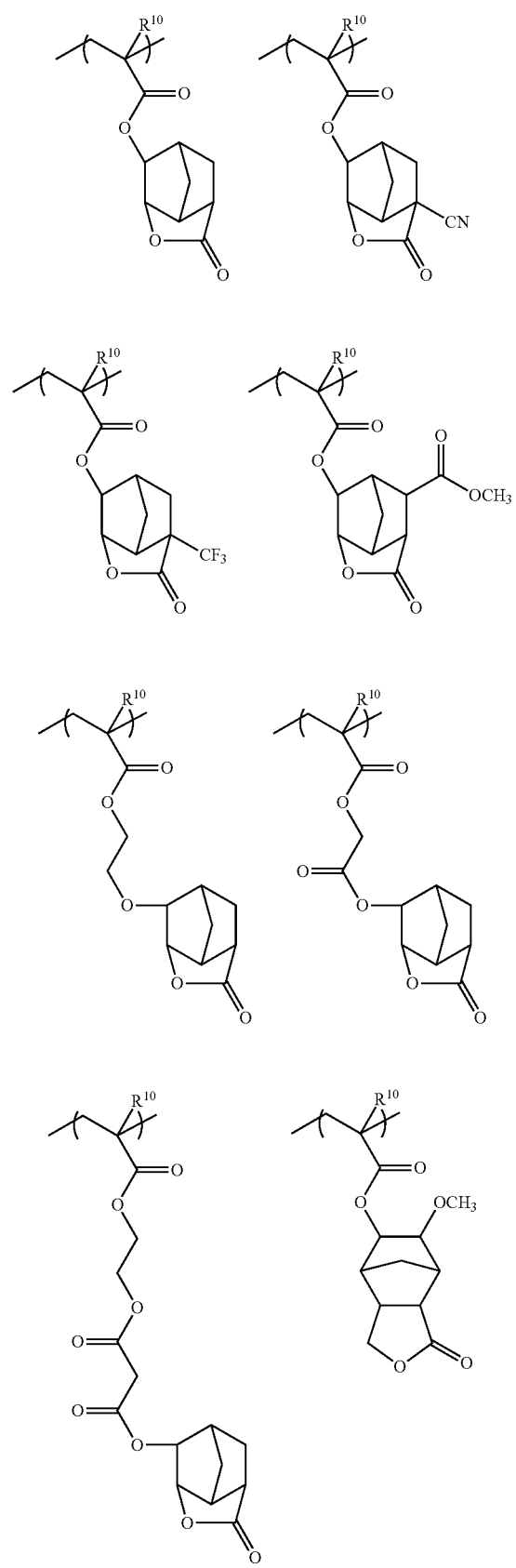

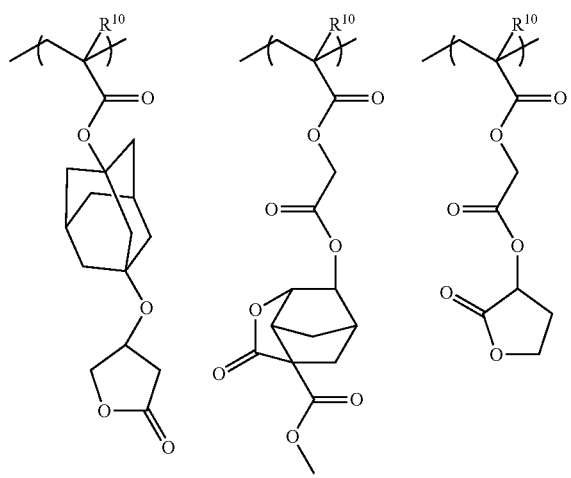
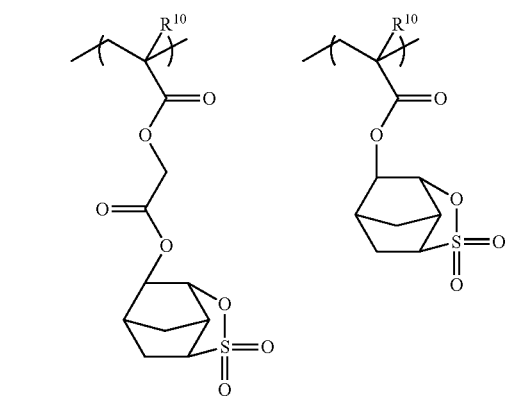
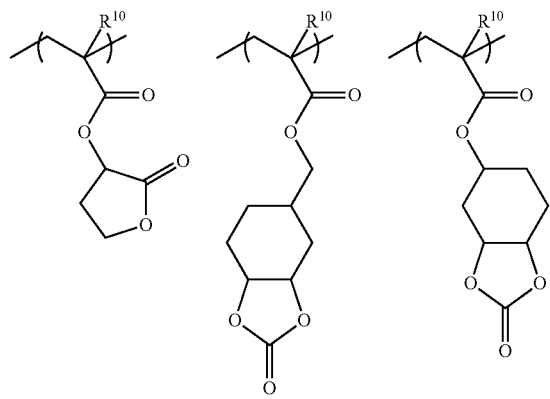
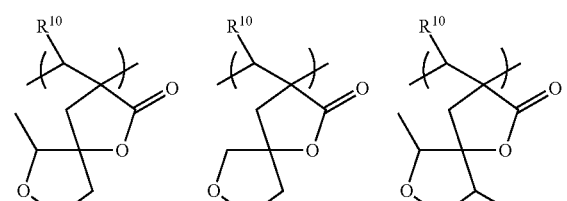
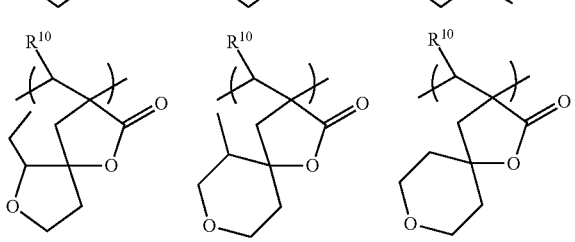
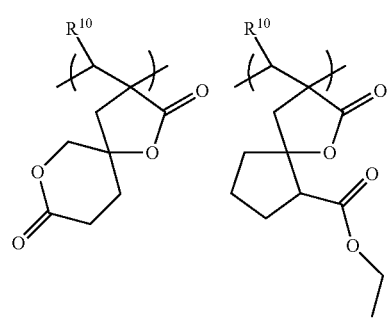
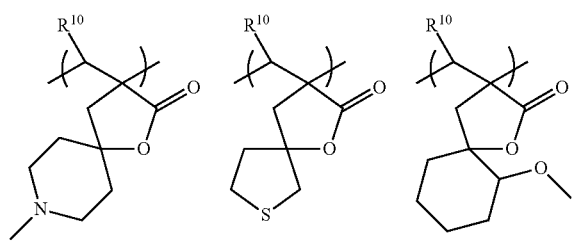
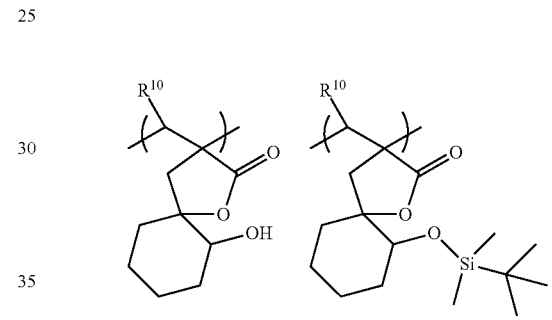
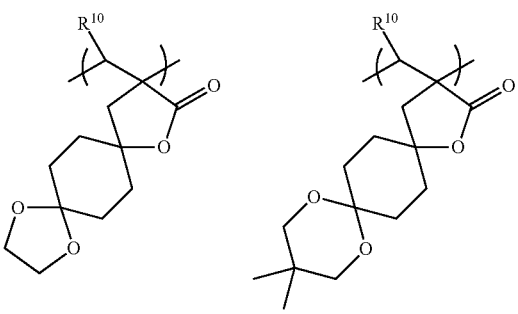
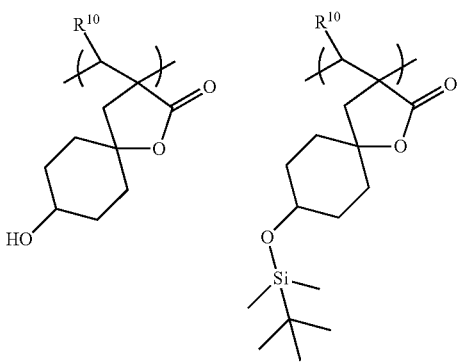

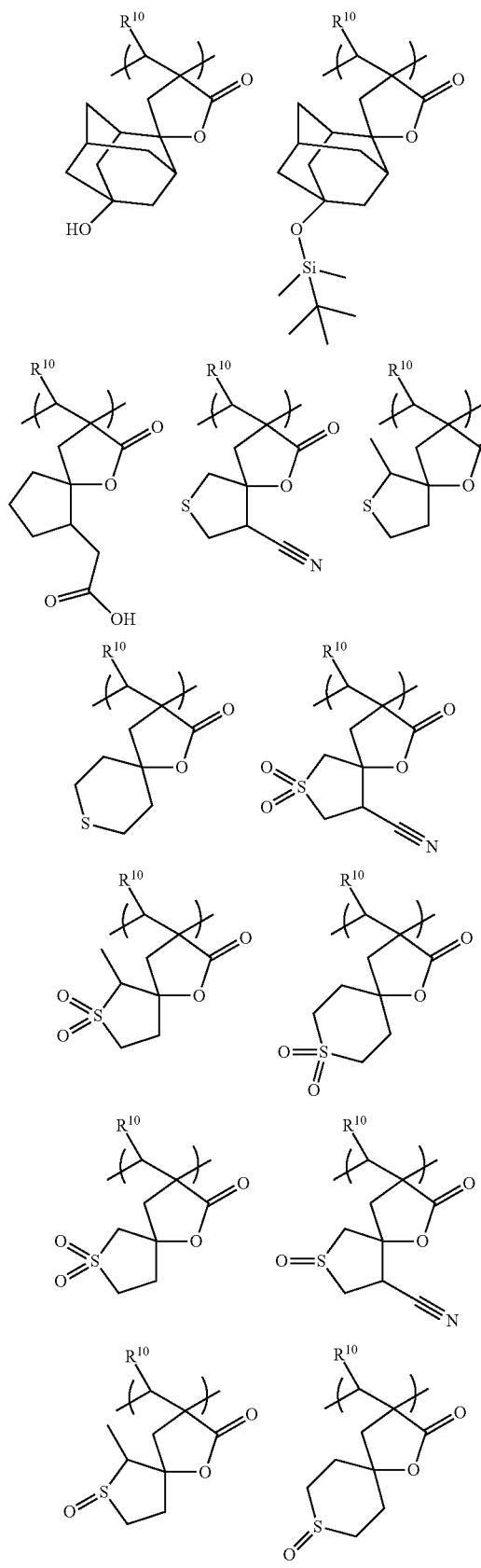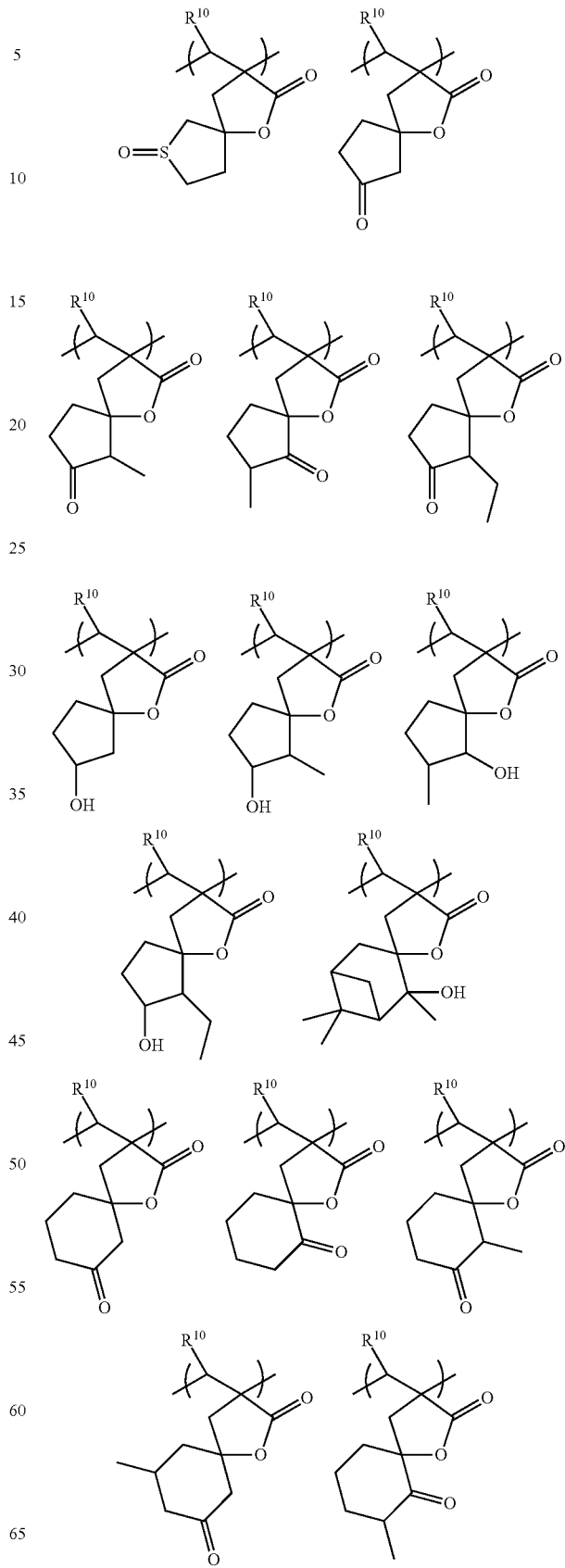

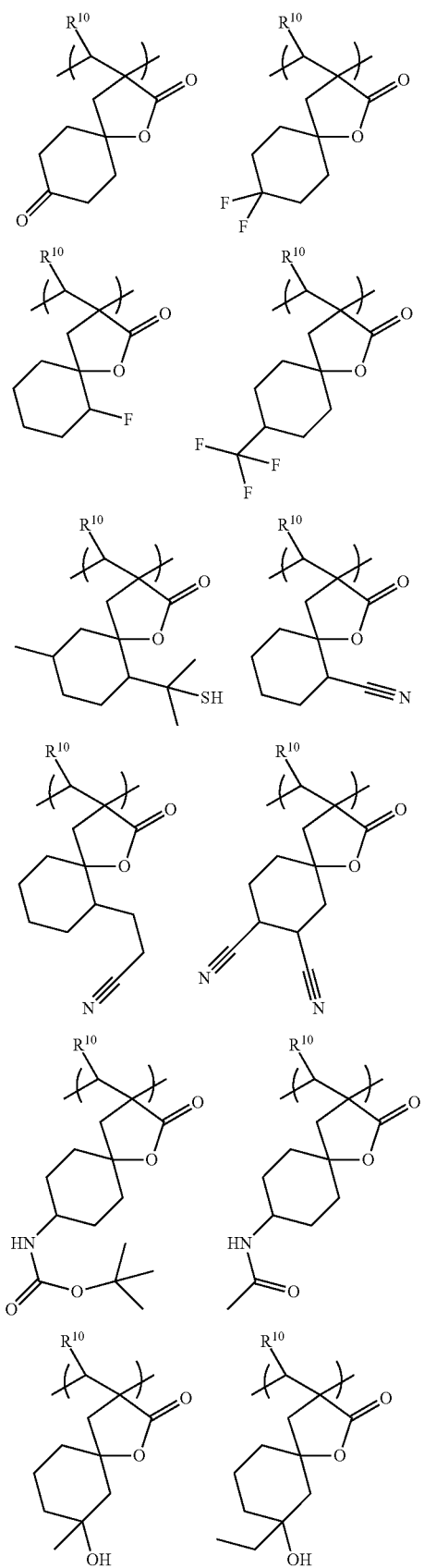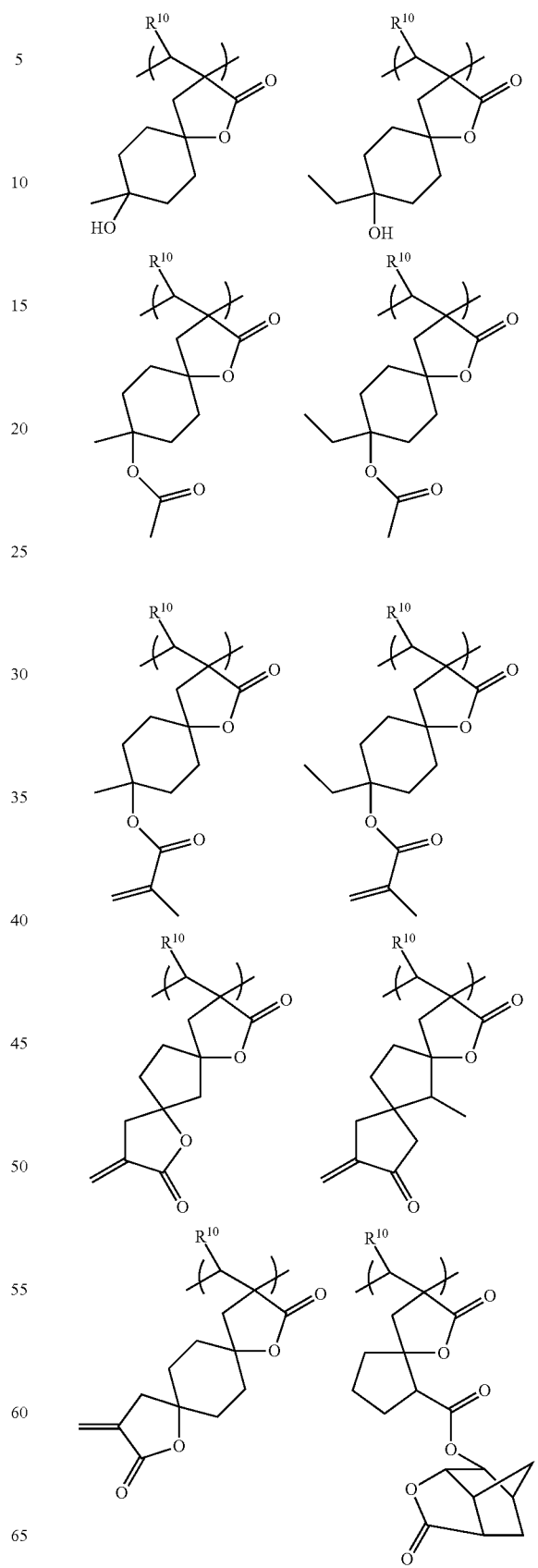

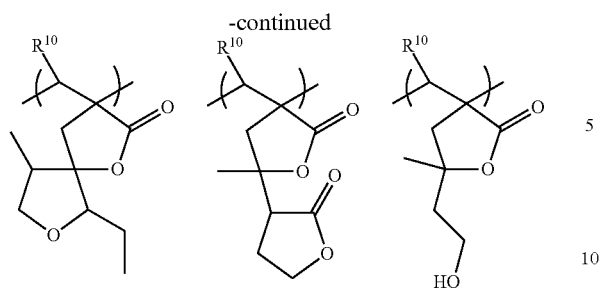

wherein $R^{10}$ is a hydrogen atom, a fluorine atom, a methyl group, or a trifluoromethyl group.

The content of the structural unit (a2) in the polymer [A] is preferably 0 to 80 mol %, more preferably 20 to 70 mol %, and still more preferably 30 to 60 mol %, based on the total structural units included in the polymer [A]. When the content of the structural unit (a2) is within the above range, a resist film that is formed using the photoresist composition exhibits improved adhesion to a substrate and the like. The polymer [A] may include only one type of the structural unit (a2), or may include two or more types of the structural unit (a2).

Examples of a preferable monomer that produces the structural unit (a2) include the monomers disclosed in WO2007/116664, the compounds represented by the following formulas, and the like.

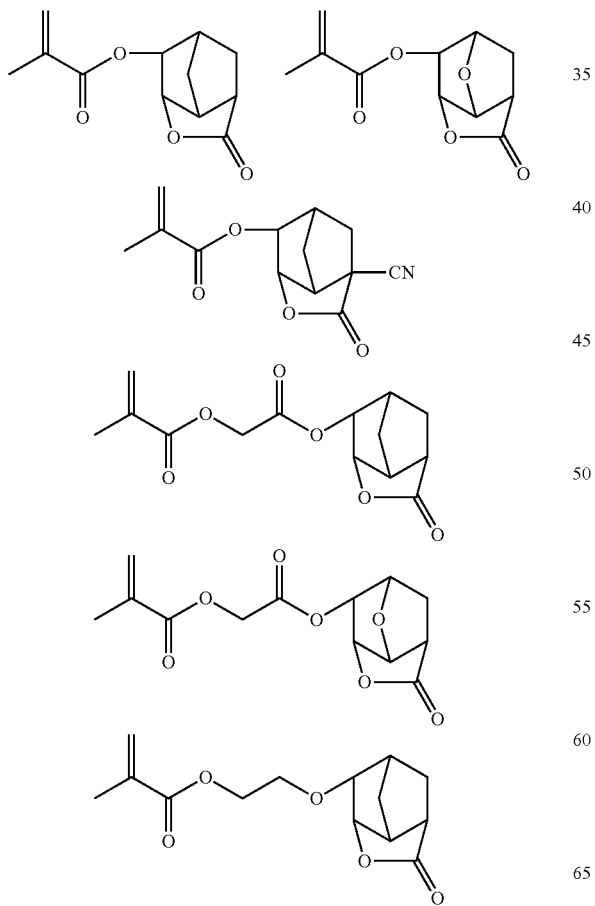
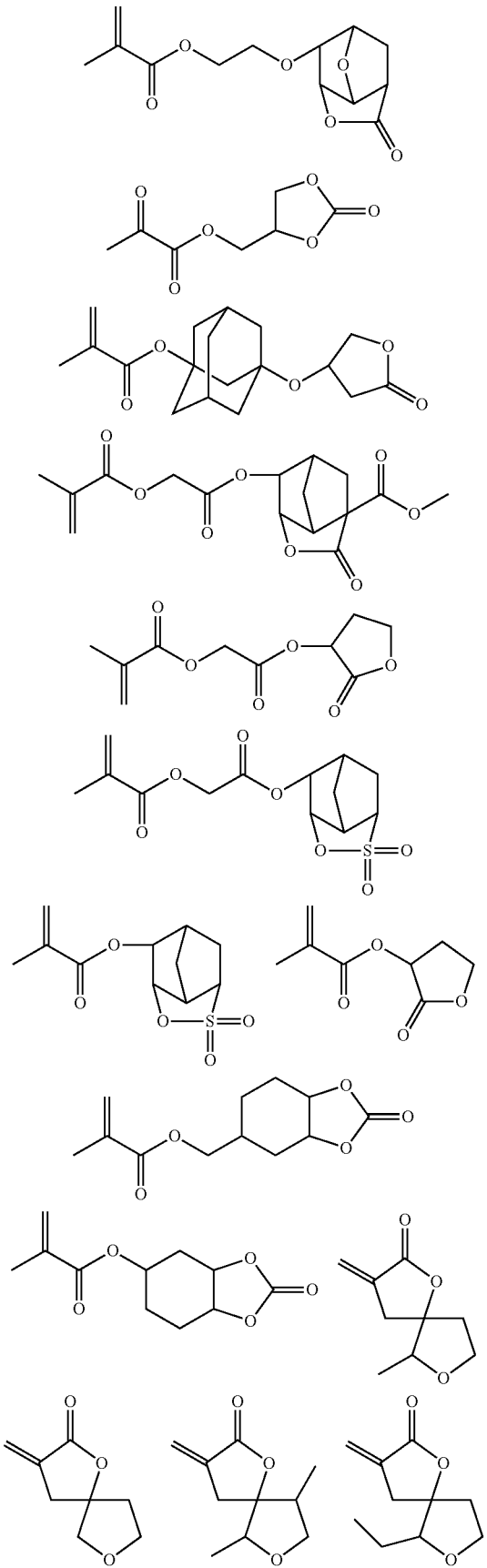

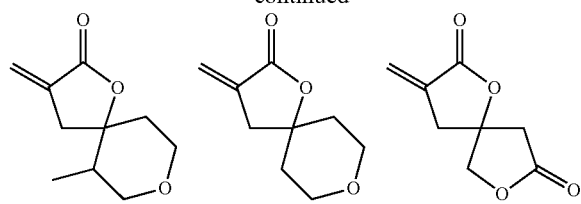
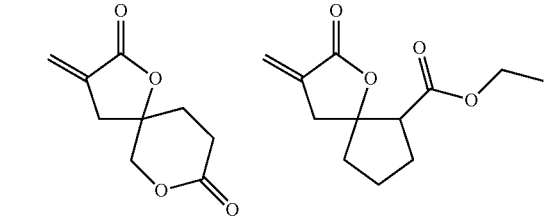
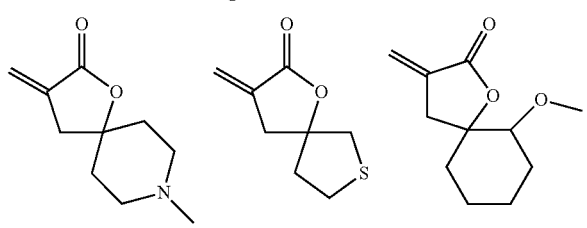
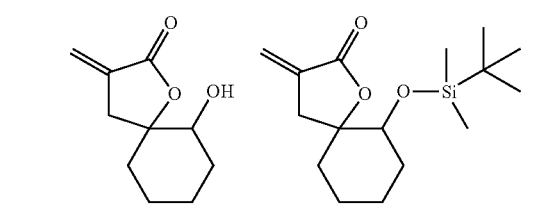
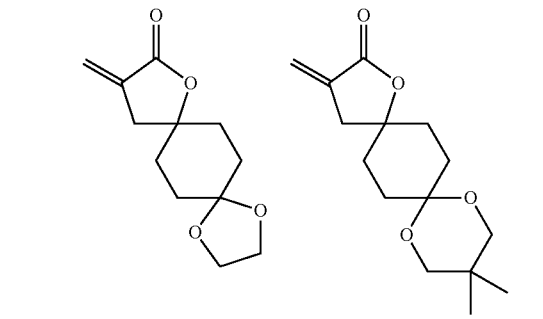
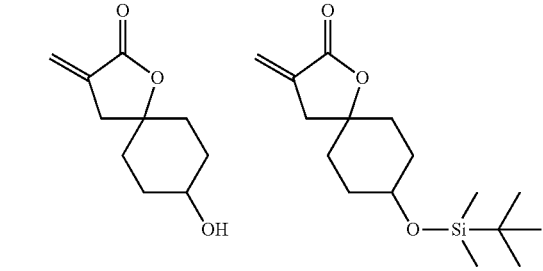
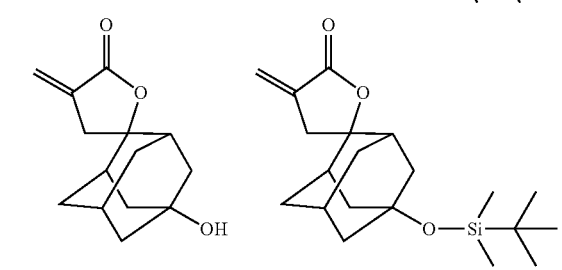
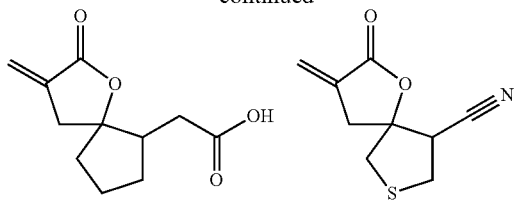
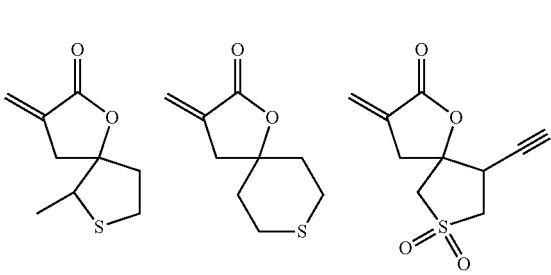
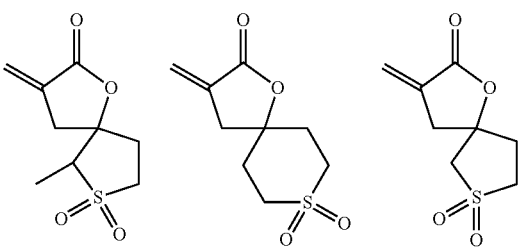
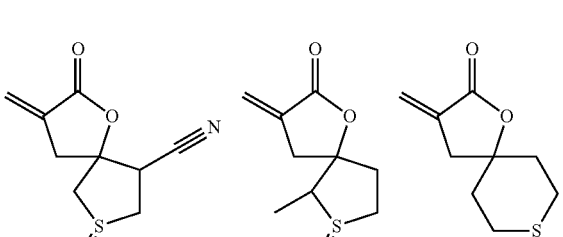
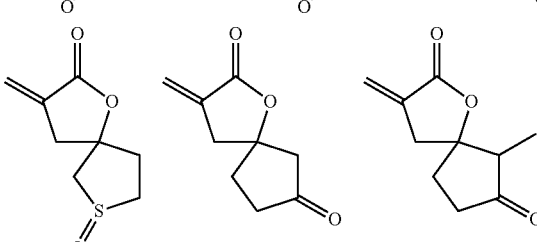
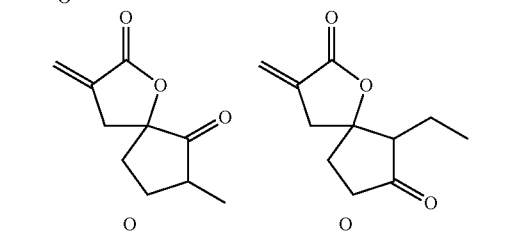
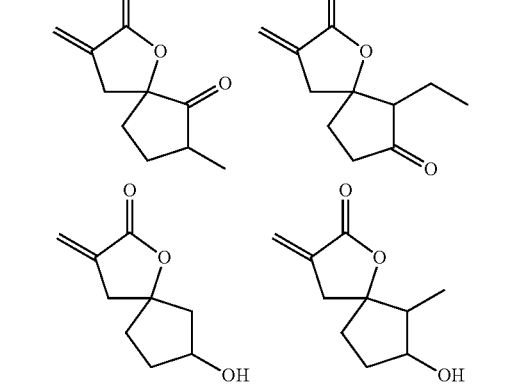

-continued
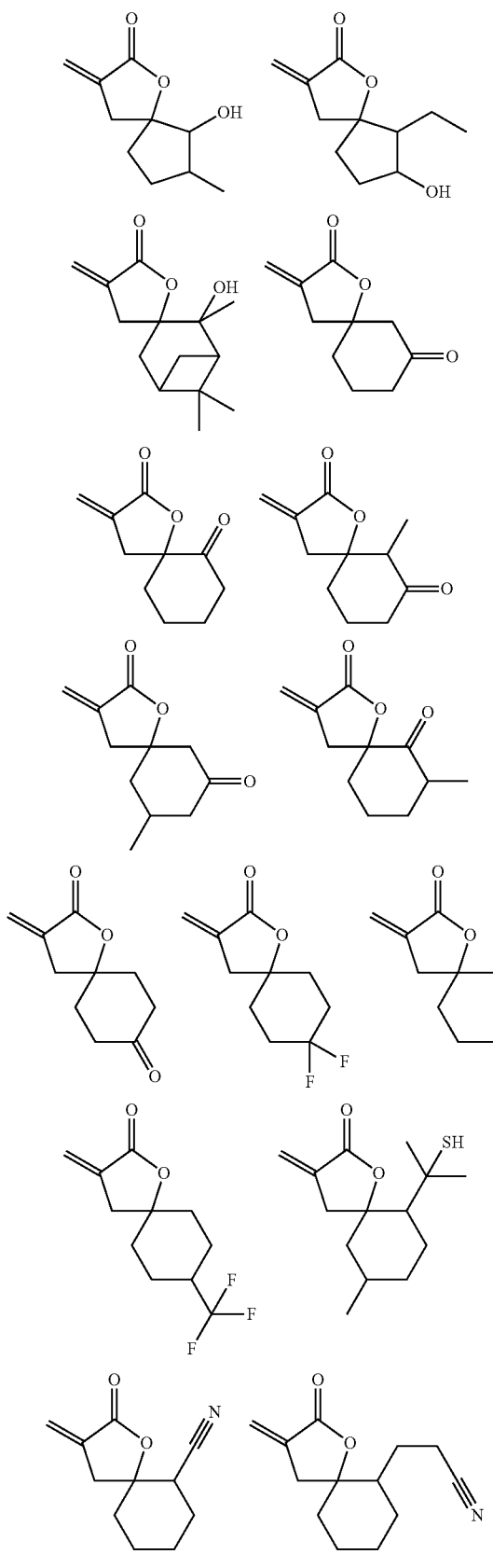
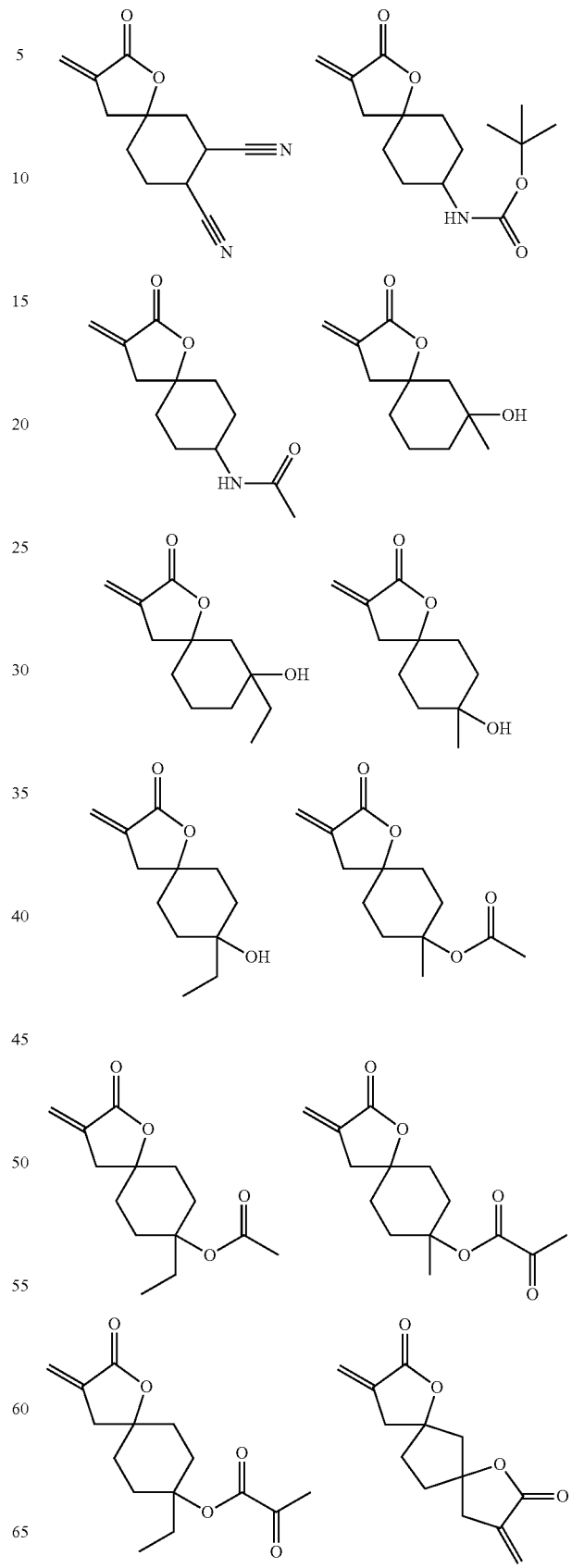

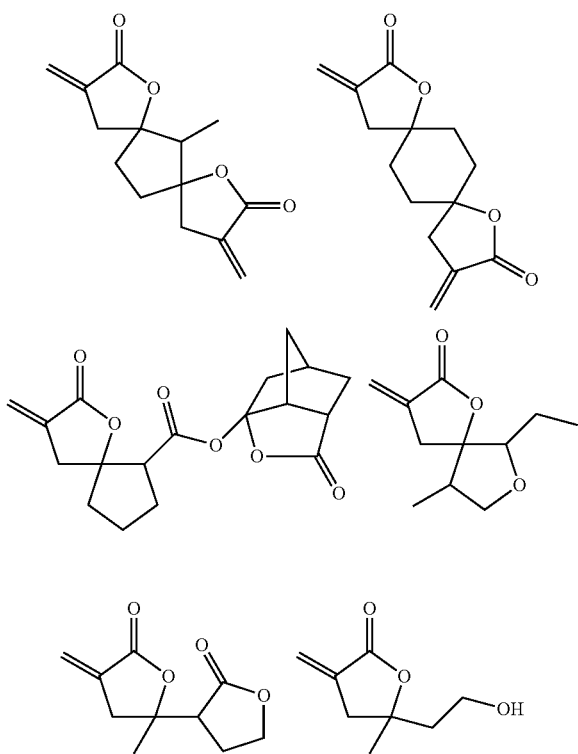

The polymer [A] may further include the structural unit (a3) that includes a polar group. Examples of the polar group include a hydroxyl group, a carboxyl group, a keto group, a sulfonamide group, an amino group, an amide group, a cyano group, and the like.

Examples of the structural unit (a3) include structural units represented by the following formulas, and the like.

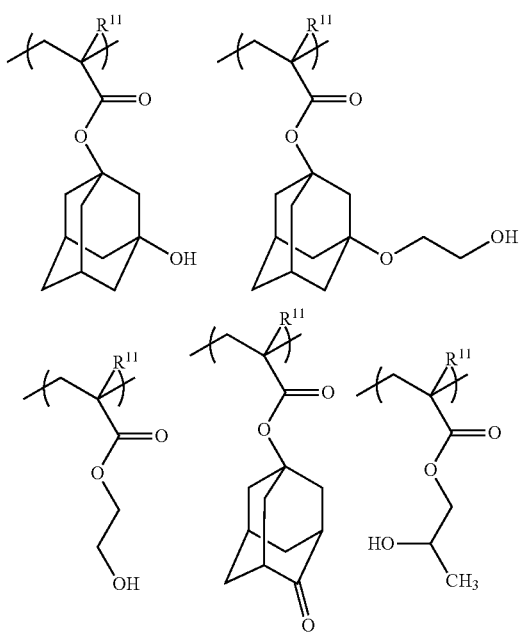

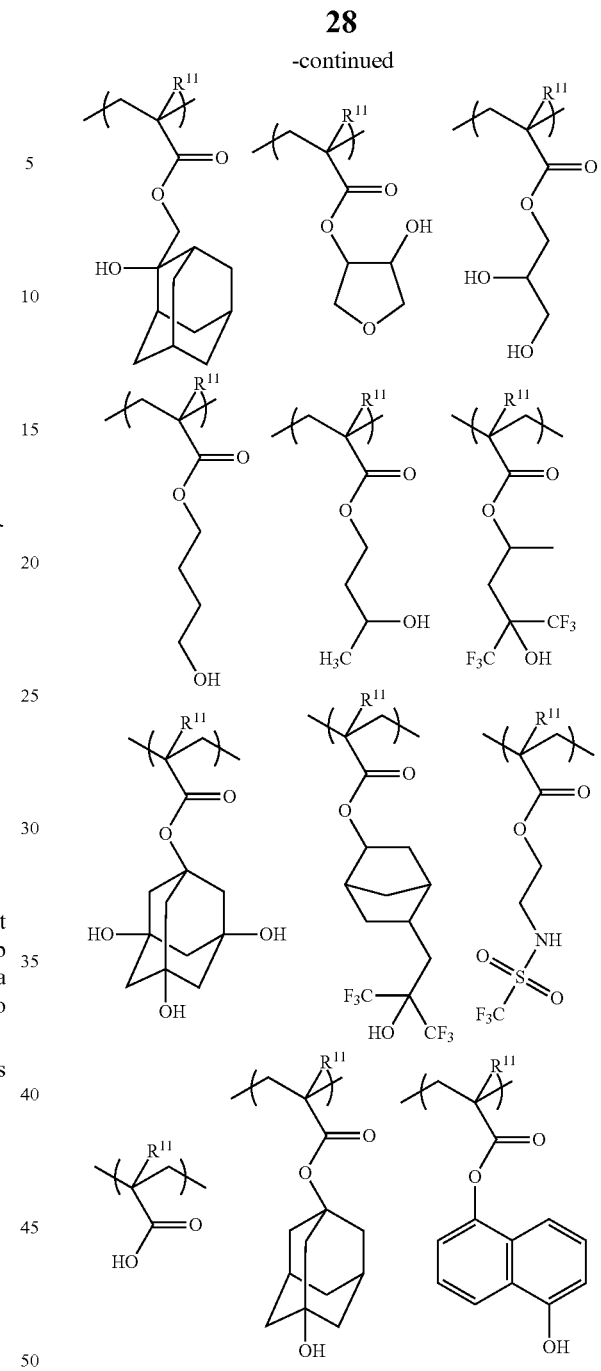

wherein $R^{11}$ is a hydrogen atom, a fluorine atom, a methyl group, or a trifluoromethyl group.

The content of the structural unit (a3) in the polymer [A] is preferably 5 to 80 mol %, and more preferably 10 to 40 mol %, based on the total structural units included in the polymer [A]. The polymer [A] may include only one type of the structural unit (a3), or may include two or more types of the structural unit (a3).

The polymer [A] may include an additional structural unit that includes an acid-labile group other than the structural unit (a1) and the structural unit (b1) (described later) as long as the advantageous effects of the invention are not impaired.

Synthesis of Polymer [A]

The polymer [A] may be synthesized by a normal method such as radical polymerization. For example, the polymer [A]

is preferably synthesized by adding a solution that includes a monomer and a radical initiator dropwise to a reaction solvent or a solution that includes a monomer to effect polymerization, adding a solution that includes a monomer and a solution that includes a radical initiator dropwise to a reaction solvent or a solution that includes a monomer to effect polymerization, or adding a plurality of solutions that respectively include a monomer and a solution that includes a radical initiator dropwise to a reaction solvent or a solution that includes a monomer to effect polymerization.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethane, and diethoxyethane; alcohols such as methanol, ethanol, 1-propanol, 2-propanol, and 4-methyl-2-pentanol; and the like. These solvents may be used either alone or in combination.

The polymerization temperature may be appropriately determined depending on the type of radical initiator, but is normally 40 to 150° C., and preferably 50 to 120° C. The polymerization (reaction) time is normally 1 to 48 hours, and preferably 1 to 24 hours.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis (2 methylpropionitrile), and the like. These initiators may be used either alone or in combination.

The polymer obtained by polymerization is preferably collected by reprecipitation. Specifically, the polymer solution is poured into a reprecipitation solvent after completion of polymerization to collect the target resin as a powder. An alcohol, an alkane, or the like may be used as the reprecipitation solvent either alone or in combination. The polymer may also be collected by removing low-molecular-weight components (e.g., monomer and oligomer) by a separation operation, a column operation, ultrafiltration, or the like.

The polystyrene-reduced weight average molecular weight (Mw) of the polymer [A] determined by gel permeation chromatography (GPC) is not particularly limited, but is preferably 1000 to 500,000, more preferably 2000 to 400,000, and still more preferably 3000 to 300,000. When the Mw of the polymer [A] is within the above range, the resulting resist exhibits excellent heat resistance and satisfactory developability.

The ratio (Mw/Mn) of the Mw to the polystyrene-reduced number average molecular weight (Mn) of the polymer [A] determined by GPC is normally 1 to 5, preferably 1 to 3, and more preferably 1 to 2. When the ratio (Mw/Mn) of the polymer [A] is within the above range, the resulting photoresist film exhibits excellent resolution.

Note that the terms "polystyrene-reduced weight average molecular weight (Mw)" and "polystyrene-reduced number average molecular weight (Mn)" used herein refer to values determined by GPC using GPC columns (manufactured by Tosoh Corporation, G2000HXL×2, G3000HXL×1, G4000HXL×1) at a flow rate of 1.0 ml/min and a column temperature of 40° C. (eluant: tetrahydrofuran, standard: monodisperse polystyrene).

Fluorine-Containing Polymer [B]

The photoresist composition includes the fluorine-containing polymer [B] that includes the structural unit (b1) that is represented by the formula (1) or (2) and includes an acid-labile group, the fluorine-containing polymer [B] having a fluorine atom content higher than that of the polymer [A]. When the photoresist composition includes the fluorine-containing polymer [B], the fluorine-containing polymer [B] tends to be unevenly distributed in the vicinity of the surface of the resist film due to the water repellency of the fluorine-containing polymer [B]. This makes it possible to suppress elution of the acid generator, an acid diffusion controller, and the like into an immersion medium during liquid immersion lithography. It is also possible to control the advancing contact angle of the resist film with the immersion medium within the desired range due to the water repellency of the fluorine-containing polymer [B], and suppress bubble defects. Moreover, since the receding contact angle of the resist film with the immersion medium increases, it is possible to implement high-speed scan exposure (i.e., water droplets do not remain). Specifically, a resist film suitable for liquid immersion lithography can be formed using the photoresist composition that includes the fluorine-containing polymer [B]. Since the fluorine-containing polymer [B] includes the structural unit (b1) that includes the acid-labile group having the above specific structure that does not easily dissociate due to an acid, the solubility of the photoresist composition in a developer that includes an organic solvent is moderately controlled, and it is possible to suppress occurrence of a missing contact hole and roughness on the surface of the exposed area after development. The photoresist composition also exhibits excellent lithographic performance (e.g., resolution and circularity).

It is preferable that the fluorine-containing polymer [B] include the structural unit (b2) represented by the formula (5) in addition to the structural unit (b1). The fluorine-containing polymer [B] may further include an additional structural unit as long as the advantageous effects of the invention are not impaired. Each structural unit is described in detail below.

Structural Unit (b1)

The structural unit (b1) is represented by the formula (1) or (2).

In the formula (1), $R^1$ is a hydrogen atom, a fluorine atom, a methyl group, or a trifluoromethyl group, and $Z^1$ is a divalent monocyclic hydrocarbon group having 5 or 6 carbon atoms or a divalent polycyclic hydrocarbon group having 7 to 10 carbon atoms.

Examples of the divalent monocyclic hydrocarbon group having 5 or 6 carbon atoms represented by $Z^1$ include a cyclopentanediyl group, a cyclohexanediyl group, a cyclopentenediyl group, a cyclohexenediyl group, and the like. Among these, a cyclopentanediyl group and a cyclohexanediyl group are preferable.

Examples of the divalent polycyclic hydrocarbon group having 7 to 10 carbon atoms represented by $Z^1$ include a norbornanediyl group, an adamantanediyl group, a norbornenediyl group, and the like. Among these, a norbornanediyl group and an adamantanediyl group are preferable.

$Z^1$ is preferably a cyclopentanediyl group or a cyclohexanediyl group.

Examples of the structural unit (b1) represented by the formula (1) include structural units represented by the following formulas (1-1) to (1-8), and the like.

(1-1)
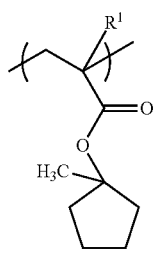

(1-2)
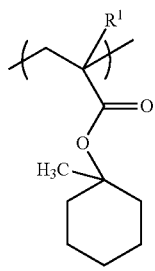

(1-3)
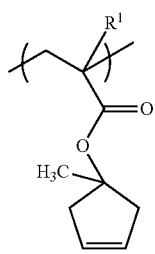

(1-4)
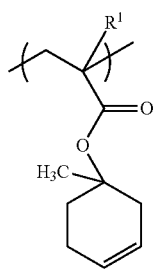

(1-5)
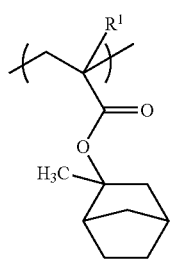

(1-6)
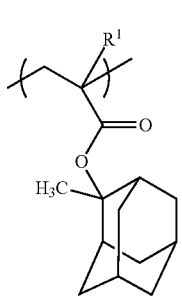

(1-7)
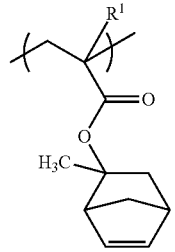

(1-8)
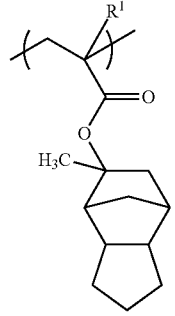

wherein $R^1$ is the same as defined for the formula (1).

Among these, the structural units represented by the formulas (1-1) and (1-2) are preferable.

Examples of a monomer that produces the structural unit (b1) represented by the formula (1) include the compounds represented by the following formulas, and the like.

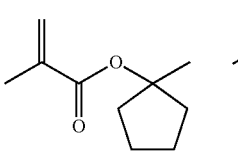
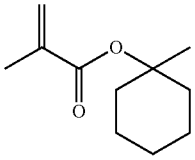
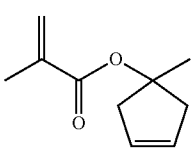
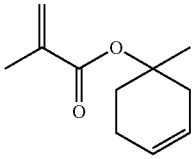
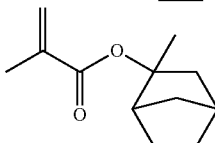
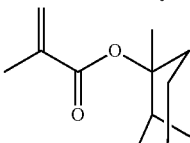
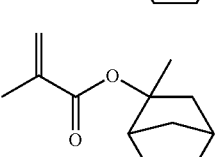
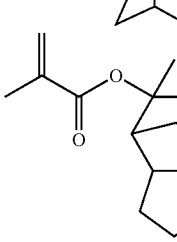

In the formula (2), $R^2$ is a hydrogen atom, a fluorine atom, a methyl group, or a trifluoromethyl group, and $R^3$ is an alicyclic hydrocarbon group having 5 to 20 carbon atoms.

Examples of the alicyclic hydrocarbon group having 2 to 20 carbon atoms represented by $R^3$ include monoalicyclic hydrocarbon groups such as a cyclopentyl group, a cyclohexyl group, a cyclooctyl group, a cyclodecyl group, and a cyclododecyl group, polyalicyclic hydrocarbon groups such as a norbornyl group and an adamantyl group, and the like. Among these, a cyclopentyl group, a cyclohexyl group, and an adamantyl group are preferable.

Examples of the structural unit (b1) represented by the formula (2) include structural units represented by the following formulas, and the like.

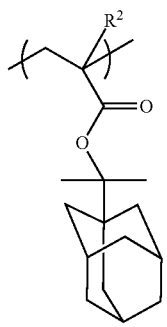
(2-1)

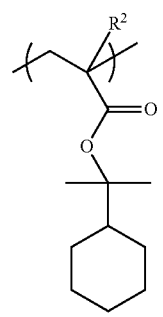
(2-2)

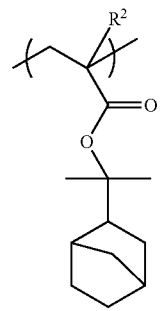
(2-3)

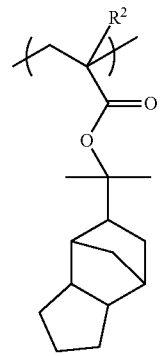
(2-4)

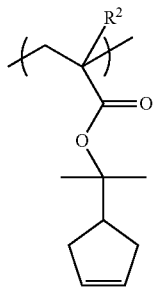
(2-5)

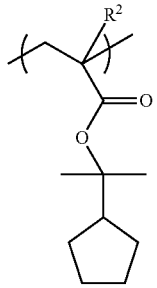
(2-6)

wherein $R^2$ is the same as defined for the formula (2).

Among these, the structural units represented by the formulas (2-1) and (2-2) are preferable.

Examples of a monomer that produces the structural unit (b1) represented by the formula (2) include the compounds represented by the following formulas, and the like.

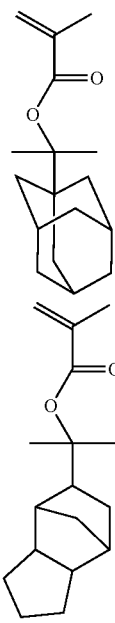 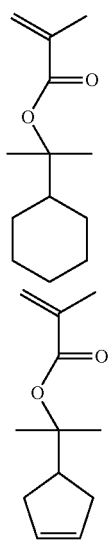 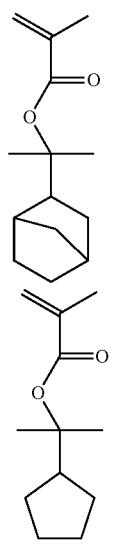

The content of the structural unit (b1) in the fluorine-containing polymer [B] is preferably 10 to 95 mol %, more preferably 30 to 90 mol %, and still more preferably 40 to 85 mol %, based on the total structural units included in the fluorine-containing polymer [B]. When the content of the structural unit (b1) is within the above range, a missing contact hole does not occur, the exposed area exhibits sufficient insolubility in a developer, and an excellent pattern can be obtained. The fluorine-containing polymer [B] may include only one type of the structural unit (b1), or may include two or more types of the structural unit (b1).

Structural Unit (b2)

The fluorine-containing polymer [B] has a fluorine atom content higher than that of the base polymer [A], and is produced by polymerizing one or more monomers that include a fluorine atom in its structure.

Examples of the monomer that produces a polymer that includes a fluorine atom in its structure include monomers that include a fluorine atom in the main chain, monomers that include a fluorine atom in the side chain, and monomers that include a fluorine atom in the main chain and the side chain.

Examples of the monomers that produce a polymer that includes a fluorine atom in the main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds in which a hydrogen atom at one or more vinyl sites is substituted with a fluorine atom, a trifluoromethyl group, or the like, and the like.

Examples of the monomers that produce a polymer that includes a fluorine atom in the side chain include compounds obtained by substituting the side chain of an alicyclic olefin compound (e.g., norbornene) with a fluorine atom, a fluoroalkyl group, or a group derived therefrom, ester compounds obtained by substituting the side chain of acrylic acid or methacrylic acid with a fluoroalkyl group or a group derived therefrom, compounds obtained by substituting the side chain (i.e., a moiety that does not include a double bond) of an olefin with a fluorine atom, a fluoroalkyl group, or a group derived therefrom, and the like.

Examples of the monomers that produce a polymer that includes a fluorine atom in the main chain and the side chain include ester compounds obtained by substituting the side chain of α-trifluoromethylacrylic acid, β-trifluoromethylacrylic acid, α,β-trifluoromethylacrylic acid, or the like with a fluoroalkyl group or a group derived therefrom, compounds obtained by substituting the side chain of a compound in which a hydrogen atom of at least one vinyl moiety is substituted with a fluorine atom, a trifluoromethyl group, or the like, with a fluorine atom, a fluoroalkyl group, or a group derived therefrom, compounds obtained by substituting a hydrogen atom bonded to the double bond of an alicyclic olefin compound with a fluorine atom, a trifluoromethyl group, or the like, and substituting the side chain of the alicyclic olefin compound with a fluoroalkyl group or a group derived therefrom, and the like. Note that the term "alicyclic olefin compound" used herein refers to a compound that includes a double bond in its ring structure.

The structural unit that includes a fluorine atom in its structure (included in the fluorine-containing polymer [B]) is not particularly limited as long as the structural unit is derived from a monomer that includes a fluorine atom in its structure. The structural unit that includes a fluorine atom in its structure is preferably the structural unit (b2) represented by the formula (5).

In the formula (5), $R^8$ is a hydrogen atom, a methyl group, or a trifluoromethyl group, X is a linking group, and $R^9$ is a linear or branched alkyl group having 1 to 10 carbon atoms or a monovalent alicyclic hydrocarbon group having 4 to 20 carbon atoms, provided that some or all of the hydrogen atoms of the alkyl group or the alicyclic hydrocarbon group are substituted with a substituent, at least one substituent being a fluorine atom.

Examples of the linking group represented by X include a single bond, an oxygen atom, a sulfur atom, an ester group, an amide group, a sulfonylamide group, a urethane group, and the like. Among these, an ester group is preferable.

Examples of the alkyl group having 1 to 10 carbon atoms represented by $R^9$ include a methyl group, an ethyl group, an n-propyl group, an i-propyl group, an n-butyl group, an i-butyl group, a t-butyl group, an n-pentyl group, an i-pentyl group, an n-hexyl group, an i-hexyl group, an n-octyl group, an i-octyl group, and the like. Among these, a methyl group, an ethyl group, an n-propyl group, an i-propyl group, an n-butyl group, an i-butyl group, a t-butyl group, an n-pentyl group, an i-pentyl group, an n-hexyl group, and an i-hexyl group (number of carbon atoms: 1 to 6) are preferable.

Examples of the monovalent alicyclic hydrocarbon group having 4 to 20 carbon atoms represented by $R^9$ include a cyclobutyl group, a cyclopentyl group, a cyclohexyl group, a norbornyl group, an adamantyl group, and the like. Among these, a cyclohexyl group is preferable.

The number of fluorine atoms as the substituent is preferably 2 to 30, more preferably 3 to 20, and still more preferably 3 to 10.

Examples of a monomer that produces the structural unit (b2) include the compounds represented by the following formulas (5-1) to (5-15), and the like.

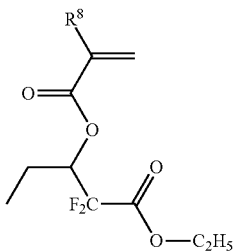

(5-1)

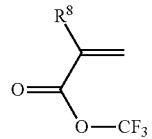

(5-2)

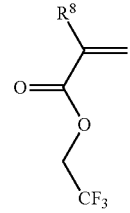

(5-3)

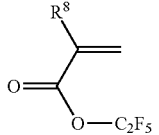

(5-4)

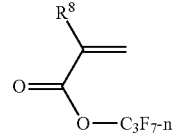

(5-5)

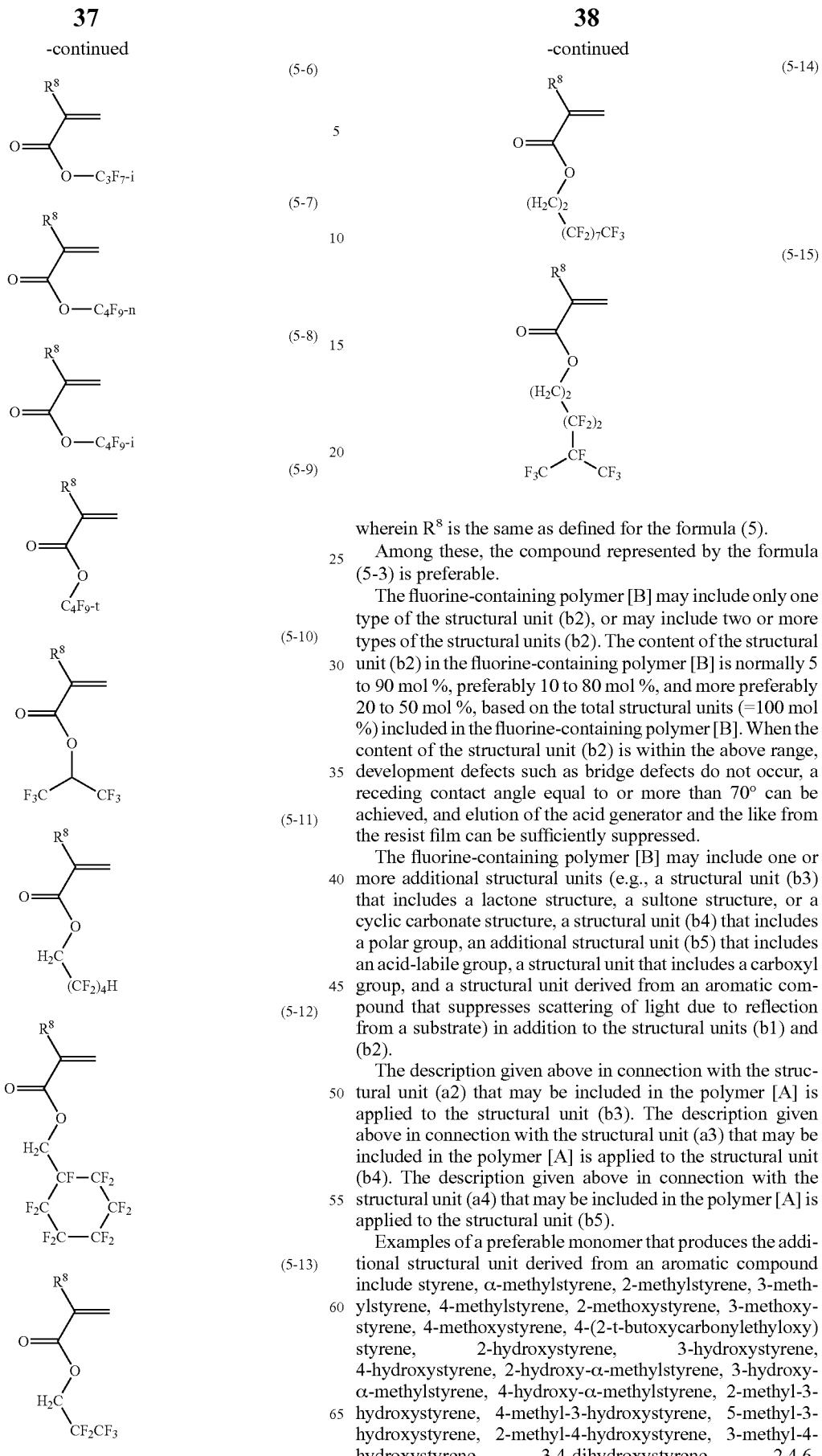

wherein $R^8$ is the same as defined for the formula (5).

Among these, the compound represented by the formula (5-3) is preferable.

The fluorine-containing polymer [B] may include only one type of the structural unit (b2), or may include two or more types of the structural units (b2). The content of the structural unit (b2) in the fluorine-containing polymer [B] is normally 5 to 90 mol %, preferably 10 to 80 mol %, and more preferably 20 to 50 mol %, based on the total structural units (=100 mol %) included in the fluorine-containing polymer [B]. When the content of the structural unit (b2) is within the above range, development defects such as bridge defects do not occur, a receding contact angle equal to or more than 70° can be achieved, and elution of the acid generator and the like from the resist film can be sufficiently suppressed.

The fluorine-containing polymer [B] may include one or more additional structural units (e.g., a structural unit (b3) that includes a lactone structure, a sultone structure, or a cyclic carbonate structure, a structural unit (b4) that includes a polar group, an additional structural unit (b5) that includes an acid-labile group, a structural unit that includes a carboxyl group, and a structural unit derived from an aromatic compound that suppresses scattering of light due to reflection from a substrate) in addition to the structural units (b1) and (b2).

The description given above in connection with the structural unit (a2) that may be included in the polymer [A] is applied to the structural unit (b3). The description given above in connection with the structural unit (a3) that may be included in the polymer [A] is applied to the structural unit (b4). The description given above in connection with the structural unit (a4) that may be included in the polymer [A] is applied to the structural unit (b5).

Examples of a preferable monomer that produces the additional structural unit derived from an aromatic compound include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6- trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl(meth)acrylate, 9-anthrylmethyl(meth)acrylate, 1-vinylpyrene, and the like.

The content of the additional structural unit in the fluorine-containing polymer [B] is normally 50 mol % or less, preferably 30 mol % or less, and more preferably 20 mol % or less, based on the total structural units (=100 mol %) included in the fluorine-containing polymer [B].

The Mw of the fluorine-containing polymer [B] is preferably 1000 to 50,000, more preferably 1000 to 30,000, and particularly preferably 1000 to 10,000. When the Mw of the fluorine-containing polymer [B] is within the above range, a sufficient receding contact angle can be obtained, and the resulting resist exhibits excellent developability. The ratio (Mw/Mn) of the Mw to the Mn of the fluorine-containing polymer [B] is normally 1 to 3, and preferably 1 to 2.

The fluorine-containing polymer [B] is preferably used in an amount of 0 to 50 parts by mass, more preferably 0 to 20 parts by mass, more preferably 0.5 to 10 parts by mass, and particularly preferably 1 to 8 parts by mass, based on 100 parts by mass of the polymer [A]. When the fluorine-containing polymer [B] is used in an amount within the above range, occurrence of a missing contact hole and roughness can be suppressed, and the water repellency and the elution resistance of the surface of the resulting resist film can be further improved.

The fluorine atom content in the fluorine-containing polymer [B] is normally 5 mass % or more, preferably 5 to 50 mass %, and more preferably 5 to 45 mass %, based on the total amount (=100 mass %) of the fluorine-containing polymer [B]. The fluorine atom content may be determined by $^{13}$C-NMR analysis. When the fluorine atom content in the fluorine-containing polymer [B] is higher than that of the polymer [A], the surface of a resist film that is formed using the photoresist composition that includes the fluorine-containing polymer [B] exhibits improved water repellency. This makes it unnecessary to form an upper layer film when performing liquid immersion lithography. It is preferable that the difference between the fluorine atom content in the polymer [A] and the fluorine atom content in the fluorine-containing polymer [B] be 1 mass % or more (more preferably 3 mass % or more).

Synthesis of Fluorine-Containing Polymer [B]

The fluorine-containing polymer [B] may be synthesized by polymerizing a monomer that corresponds to each structural unit in an appropriate solvent using a radical initiator, for example.

Examples of the radical initiator and the solvent used for polymerization include those mentioned above in connection with synthesis of the polymer [A].

The polymerization temperature is normally 40 to 150° C., and preferably 50 to 120° C. The polymerization (reaction) time is normally 1 to 48 hours, and preferably 1 to 24 hours.

Acid Generator [C]

The photoresist composition includes the acid generator [C]. The acid generator [C]generates an acid upon exposure performed when forming a pattern. The acid-labile groups included in the polymer [A] and the fluorine-containing polymer [B] dissociate due to the acid generated by the acid generator [C], and the exposed area becomes scarcely soluble in a developer that includes an organic solvent. The acid generator [C] may be included in the photoresist composition as a free compound and/or may be included in the polymer.

Examples of the acid generator [C] include onium salt compounds such as sulfonium salts and iodonium salts, organic halogen compounds, and sulfone compounds such as disulfones and diazomethanesulfones. Specific examples of a preferable acid generator [C] include the compounds disclosed in paragraphs [0080] to [0113] of Japanese Patent Application Publication (KOKAI) No. 2009-134088, and the like.

Specific examples of a preferable acid generator [C] include diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl) iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium 1,1-difluoro-2-(1-adamantanecarbonyloxy)ethane-1-sulfonate, triphenylsulfonium 1,1-difluoro-2-(1-adamantyl)ethane-1-sulfonate, 4-cyclohexylphenyldiphenylsulfonium nonafluoro-n-butanesulfonate, triphenylsulfonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-hydroxy-1-naphthyltetrahydrothiophenium nonafluoro-n-butanesulfonate, 4-hydroxy-1-naphthyltetrahydrothiophenium perfluoro-n-octanesulfonate, 1-(1-naphthylacetomethyl)tetrahydrothiophenium trifluoromethanesulfonate, 1-(1-naphthylacetomethyl)tetrahydrothiophenium nonafluoro-n-butanesulfonate, 1-(1-naphthylacetomethyl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, trifluoromethane sulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, and the like. Among these, triphenylsulfonium 1,1-difluoro-2-(1-adamantanecarbonyloxy)ethane-1-sulfonate, triphenylsulfonium 1,1-difluoro-2-(1-adamantyl)ethane-1-sulfonate, and 4-cyclohexylphenyldiphenylsulfonium nonafluoro-n-butanesulfonate are preferable.

These acid generators [C] may be used either alone or in combination. The acid generator [C] is normally used in an amount of 0.1 to 20 parts by mass, and preferably 0.5 to 10 parts by mass, based on 100 parts by mass of the polymer [A], from the viewpoint of ensuring that the resulting resist exhibits sufficient sensitivity and developability. When the acid generator [C] is used in an amount within the above range, the photoresist composition exhibits excellent sensitivity, developability, and transparency, and can produce the desired resist pattern.

Nitrogen-Containing Compound [D]

It is preferable that the photoresist composition further include [D] a nitrogen-containing compound. The nitrogen-containing compound [D] controls a phenomenon in which the acid generated by the acid generator [C] upon exposure diffuses in the resist film, and suppresses undesired chemical reactions in the unexposed area. The nitrogen-containing compound [D] thus improves the resolution of the resulting resist, and improves the storage stability of the photoresist composition. The nitrogen-containing compound [D] may be included in the photoresist composition as a free compound and/or may be included in the polymer.

Examples of the nitrogen-containing compound [D] include a compound represented by the following formula, and the like.

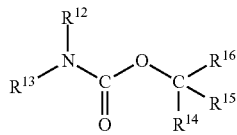

wherein $R^{12}$ to $R^{16}$ are independently a hydrogen atom, a linear, branched, or cyclic alkyl group having 1 to 20 carbon atoms, an aryl group, or an aralkyl group, provided that these groups may be substituted with a substituent, $R^{12}$ and $R^{13}$ may bond to each other to form a divalent saturated or unsaturated hydrocarbon group having 4 to 20 carbon atoms or a derivative thereof together with the nitrogen atom that is bonded to $R^{12}$ and $R^{13}$, and $R^{14}$ and $R^{15}$ may bond to each other to form a divalent saturated or unsaturated hydrocarbon group having 4 to 20 carbon atoms or a derivative thereof together with the carbon atom that is bonded to $R^{14}$ and $R^{15}$.

Examples of the nitrogen-containing compound [D] represented by the above formula include N-t-alkylalkoxycarbonyl group-containing amino compounds such as N-t-butoxycarbonyldi-n-octylamine, N-t-amyloxycarbonyldi-n-octylamine, N-t-butoxycarbonyldi-n-nonylamine, N-t-amyloxycarbonyldi-n-nonylamine, N-t-butoxycarbonyldi-n-decylamine, N-t-amyloxycarbonyldi-n-decylamine, N-t-butoxycarbonyldicyclohexylamine, N-t-amyloxycarbonyldicyclohexylamine, N-t-butoxycarbonyl-1-adamantylamine, N-t-amyloxycarbonyl-1-adamantylamine, N-t-butoxycarbonyl-2-adamantylamine, N-t-amyloxycarbonyl-2-adamantylamine, N-t-butoxycarbonyl-N-methyl-1-adamantylamine, N-t-amyloxycarbonyl-N-methyl-1-adamantylamine, (S)-(−)-1-(t-butoxycarbonyl)-2-pyrrolidinemethanol, (S)-(−)-1-(t-amyloxycarbonyl)-2-pyrrolidinemethanol, (R)-(+)-1-(t-butoxycarbonyl)-2-pyrrolidinemethanol, (R)-(+)-1-(t-amyloxycarbonyl)-2-pyrrolidinemethanol, N-t-butoxycarbonyl-4-hydroxypiperidine, N-t-amyloxycarbonyl-4-hydroxypiperidine, N-t-butoxycarbonylpyrrolidine, N-t-amyloxycarbonylpyrrolidine, N,N'-di-t-butoxycarbonylpiperazine, N,N'-di-t-amyloxycarbonylpiperazine, N,N-di-t-butoxycarbonyl-1-adamantylamine, N,N-di-t-amyloxycarbonyl-1-adamantylamine, N-t-butoxycarbonyl-4,4'-diaminodiphenylmethane, N-t-amyloxycarbonyl-4,4'-diaminodiphenylmethane, N,N'-di-t-butoxycarbonylhexamethylenediamine, N,N'-di-t-amyloxycarbonylhexamethylenediamine, N,N,N',N'-tetra-t-butoxycarbonylhexamethylenediamine, N,N,N',N'-tetra-t-amyloxycarbonylhexamethylenediamine, N,N'-di-t-butoxycarbonyl-1,7-diaminoheptane, N,N'-di-t-amyloxycarbonyl-1,7-diaminoheptane, N,N'-di-t-butoxycarbonyl-1,8-diaminooctane, N,N'-di-t-amyloxycarbonyl-1,8-diaminooctane, N,N'-di-t-butoxycarbonyl-1,9-diaminononane, N,N'-di-t-amyloxycarbonyl-1,9-diaminononane, N,N'-di-t-butoxycarbonyl-1,10-diaminodecane, N,N'-di-t-amyloxycarbonyl-1,10-diaminodecane, N,N'-di-t-butoxycarbonyl-1,12-diaminododecane, N,N'-di-t-amyloxycarbonyl-1,12-diaminododecane, N,N'-di-t-butoxycarbonyl-4,4'-diaminodiphenylmethane, N,N'-di-t-amyloxycarbonyl-4,4'-diaminodiphenylmethane, N-t-butoxycarbonylbenzimidazole, N-t-butoxycarbonylbenzimidazole, N-t-amyloxycarbonyl-2-methylbenzimidazole, N-t-butoxycarbonyl-2-phenylbenzimidazole, and N-t-amyloxycarbonyl-2-phenylbenzimidazole, and the like. Among these, N-t-amyloxycarbonyl-4-hydroxypiperidine is preferable.

Further examples of the nitrogen-containing compound [C] include tertiary amine compounds, quaternary ammonium hydroxide compounds, photodegradable base compounds, nitrogen-containing heterocyclic compounds, and the like.

Examples of the tertiary amines include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyldimethylamine, dicyclohexylmethylamine, and tricyclohexylamine, aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline, alkanolamines such as triethanolamine and N,N-di(hydroxyethyl)aniline, N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, bis(2-dimethylaminoethyl)ether, bis(2-diethylaminoethyl)ether, and the like. Among these, alkanolamines are preferable, and triethanolamine is more preferable.

Examples of the quaternary ammonium hydroxide compounds include tetra-n-propylammonium hydroxide, tetra-n-butylammonium hydroxide, and the like.

The photodegradable base compound may be an onium salt compound that decomposes upon exposure, and loses basicity (i.e., acid diffusion controllability). Specific examples of the onium salt compound include a sulfonium salt compound represented by the following formula (6-1) and an iodonium salt compound represented by the following formula (6-2).

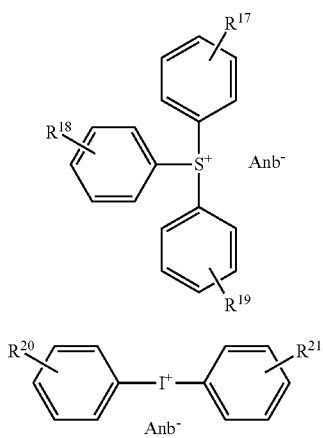

(6-1)

(6-2)

wherein $R^{17}$ to $R^{21}$ are independently a hydrogen atom, an alkyl group, an alkoxy group, a hydroxyl group, or a halogen atom, and Anb$^-$ is OH$^-$, $R^{22}$COO$^-$, $R^{22}$—SO$_3^-$ (wherein $R^{22}$ is an alkyl group, an aryl group, or an alkanol group), or an anion represented by the following formula (7).

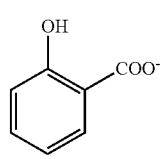

(7)

Specific examples of the sulfonium salt compound and the iodonium salt compound include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl) iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, 4-t-butoxyphenyldiphenylsulfonium 10-camphorsulfonate, and the like. Among these, triphenylsulfonium salicylate is preferable.

The nitrogen-containing compound [D] is preferably used in an amount of 10 parts by mass or less, and more preferably 8 parts by mass or less, based on 100 parts by mass of the polymer [A]. When the nitrogen-containing compound [D] is used in an amount within the above range, a resist film that is formed using the photoresist composition exhibits excellent sensitivity.

Solvent [E]

The photoresist composition normally includes [E] a solvent. Examples of the solvent [E] include alcohol-based solvents, ketone-based solvents, amide-based solvents, ether-based solvents, ester-based solvents, a mixed solvent thereof, and the like.

Examples of the alcohol-based solvents include monohydric alcohol-based solvents such as methanol, ethanol, n-propanol, iso-propanol, n-butanol, iso-butanol, sec-butanol, tert-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like.

Examples of the ketone-based solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, diacetone alcohol, acetophenone, and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester-based solvents include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Further examples of the solvent [E] include aliphatic hydrocarbon-based solvents such as n-pentane, isopentane, n-hexane, isohexane, n-heptane, isoheptane, 2,2,4-trimethylpentane, n-octane, isooctane, cyclohexane, and methylcyclohexane;

aromatic hydrocarbon-based solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, anisole, and n-amylnaphthalene;
halogen-containing solvents such as dichloromethane, chloroform, fluorocarbon, chlorobenzene, and dichlorobenzene; and the like.

Among these, propylene glycol monomethyl ether acetate, propylene glycol monomethyl ether, ethyl lactate, γ-butyrolactone, and cyclohexanone, are preferable.

Additional Optional Component

The photoresist composition may include an uneven distribution promoter, an alicyclic skeleton-containing compound, a surfactant, a sensitizer, and the like as long as the advantageous effects of the invention are not impaired. These additional optional components are described in detail below. These additional optional components may respectively be used either alone or in combination. The content of each additional optional component may be appropriately determined depending on the objective.

Uneven Distribution Promoter

The photoresist composition may include the uneven distribution promoter when the photoresist composition is used to form a resist pattern using liquid immersion lithography, for example. When the photoresist composition includes the uneven distribution promoter, the polymer [B] can be more advantageously unevenly distributed in the vicinity of the surface area. Examples of the uneven distribution promoter include γ-butyrolactone, propylene carbonate, and the like.

Alicyclic Skeleton-Containing Compound

The alicyclic skeleton-containing compound further improves the dry etching resistance, the pattern shape, adhesion to a substrate, and the like.

Surfactant

The surfactant improves applicability, striation, developability, and the like.

Sensitizer

The sensitizer absorbs the energy of radiation, and transmits the energy to the acid generator [C], so that the amount of acid generated increases. The sensitizer thus improves the apparent sensitivity of the photoresist composition.

Preparation of Photoresist Composition

The photoresist composition may be prepared by mixing the polymer [A], the fluorine-containing polymer [B], the acid generator [C], the nitrogen-containing compound [D] (optional), and an additional optional component in the solvent [E] in a given ratio, for example. The photoresist composition is normally prepared by dissolving the components in the solvent [E] so that the total solid content is 1 to 50 mass %, and preferably 2 to 25 mass %, and filtering the solution using a filter having a pore size of about 0.2 μm, for example.

Pattern-Forming Method

The photoresist composition according to the embodiments of the invention may suitably be used for a pattern-forming method that utilizes a developer that includes an organic solvent (organic solvent developer). Examples of the pattern-forming method for which the photoresist composition may suitably be used include a pattern-forming method that includes (1) forming a resist film on a substrate using the photoresist composition (hereinafter may be referred to as "step (1)"), (2) exposing the resist film (hereinafter may be referred to as "step (2)"), and (3) developing the exposed resist film using a developer having an organic solvent content of 80 mass % or more (hereinafter may be referred to as "step (3)"). Each step is described in detail below. Note that the exposure method employed in the exposure step (2) of the pattern-forming method is not particularly limited. Since the photoresist composition can suitably be used for liquid immersion lithography, each step is described below taking liquid immersion lithography as an example.

Step (1)

In the step (1), the photoresist composition is applied to a substrate either directly or through an underlayer film or the like to form a resist film. A silicon wafer, an aluminum-coated wafer, or the like may be used as the substrate. An organic or inorganic antireflective film as disclosed in Japanese Patent Publication (KOKOKU) No. 6-12452, Japanese Patent Application Publication (KOKAI) No. 59-93448, or the like may be formed on the substrate. The underlayer film or the like are not particularly limited as long as the underlayer film or the like is formed of a material that is insoluble in a developer used for development after exposure, and can be etched by a known etching method. For example, a material that is normally used as an undercoat material when producing a semiconductor device or a liquid crystal display device may be used as the material for forming the underlayer film or the like.

The photoresist composition may be applied by spin coating, cast coating, roll coating, or the like. The thickness of the resist film is normally 0.01 to 1 μm, and preferably 0.01 to 0.5 μm.

The resist film formed by applying the photoresist composition may optionally be prebaked (PB) to vaporize the solvent from the resist film. The PB temperature may be appropriately selected depending on the composition (components) of the photoresist composition, but is normally about 30 to about 200° C., and preferably 50 to 150° C.

A protective film as disclosed in Japanese Patent Application Publication (KOKAI) No. 5-188598 or the like may be formed on the resist layer in order to prevent the effects of basic impurities and the like contained in the environmental atmosphere. In order to prevent elution of the acid generator and the like from the resist layer, a liquid immersion lithography protective film as disclosed in Japanese Patent Application Publication (KOKAI) No. 2005-352384 or the like may also be formed on the resist layer. Note that these techniques may be used in combination.

Step (2)

In the step (2), the desired area of the resist film formed by the step (1) is subjected to reduced projection exposure via a mask having a specific pattern (e.g., dot pattern or line pattern) and an immersion liquid. For example, the desired area of the resist film may be subjected to reduced projection exposure via an isolated line pattern mask to form a trench pattern. The resist film may be exposed a plurality of times using the desired pattern mask and another pattern mask. In this case, it is preferable to continuously (successively) expose the resist film. For example, the desired area of the resist film may be subjected to first reduced projection exposure via a line-and-space pattern mask, and then subjected to second reduced projection exposure so that the exposed areas (lines) intersect. It is preferable that the area subjected to the first reduced projection exposure perpendicularly intersect the area subjected to the second reduced projection exposure. This makes it easy to form a circular contact hole pattern in the unexposed area enclosed by the exposed area. Examples of the immersion liquid used for exposure include water, a fluorine-containing inert liquid, and the like. It is preferable that the immersion liquid be transparent to the exposure wavelength, and have a temperature coefficient of the refractive index as small as possible so that distortion of an optical image projected onto the film is minimized. When using an ArF excimer laser (wavelength: 193 nm) as the exposure light source, it is preferable to use water from the viewpoint of availability and ease of handling.

Radiation (light source) used for exposure is appropriately selected from ultraviolet rays, deep ultraviolet rays, X-rays, charged particle rays, and the like depending on the type of the acid generator. It is preferable to use deep ultraviolet rays such as ArF excimer laser light or KrF excimer laser light (wavelength: 248 nm). It is more preferable to use ArF excimer laser light. The exposure conditions (e.g., dose) may be appropriately selected depending on the composition of the photoresist composition, the type of additive, and the like. The pattern-forming method may include a plurality of exposure steps. An identical light source or a different light source may be used for each exposure step. Note that it is preferable to use ArF excimer laser light in the first exposure step.

It is preferable to perform post-exposure bake (PEB) after exposure. The acid-labile group included in the composition dissociates smoothly due to PEB. The PEB temperature is normally 30 to 200° C., preferably 50 to 170° C., more preferably 60 to 120° C., and still more preferably 70 to 100° C. The advantageous effects of the invention can be further improved by performing PEB at a low temperature of 70 to 100° C.

Step (3)

In the step (3), the resist film exposed in the step (2) is developed using a negative developer that includes an organic solvent to form a pattern (e.g., trench pattern and/or hole pattern). The term "negative developer" used herein refers to a developer that selectively dissolves and removes a low-dose exposed area and an unexposed area. The organic solvent included in the negative developer is preferably at least one solvent selected from the group consisting of alcohol-based solvents, ether-based solvents, ketone-based solvents, amide-based solvents, ester-based solvents, and hydrocarbon-based solvents. Examples of these organic solvents include those mentioned above in connection with the solvent [E].

The organic solvent included in the negative developer is preferably butyl acetate, methyl n-pentyl ketone, isoamyl acetate, or anisole. These organic solvents may be used either alone or in combination.

The content of the organic solvent in the developer is 80 mass % or more, preferably 90 mass % or more, and still more preferably 99 mass % or more. When the content of the organic solvent in the developer is 80 mass % or more, excellent developability can be obtained, and a pattern that exhibits excellent lithographic performance can be formed. Examples of the components other than the organic solvent include water, silicone oil, a surfactant, and the like.

An appropriate amount of a surfactant may optionally be added to the developer. An ionic or nonionic fluorine-based and/or silicon-based surfactant or the like may be used as the surfactant.

Examples of the development method include a dipping method that immerses the substrate in a container filled with the developer for a given time, a puddle method that allows the developer to be present on the surface of the substrate for a given time due to surface tension, a spray method that sprays the developer onto the surface of the substrate, a dynamic dispensing method that applies the developer to the substrate that is rotated at a constant speed while scanning with a developer application nozzle at a constant speed, and the like.

The resist film may be rinsed with a rinse agent after the step (3). It is preferable that the rinse agent include an organic solvent in the same manner as the developer. Scum can be efficiently washed away by utilizing such a rinse agent. A hydrocarbon-based solvent, a ketone-based solvent, an ester-based solvent, an alcohol-based solvent, an amide-based solvent, or the like is preferable as the rinse agent. Among these, an alcohol-based solvent and an ester-based solvent are preferable, and a monohydric alcohol-based solvent having 6 to 8 carbon atoms is more preferable. Examples of the monohydric alcohol having 6 to 8 carbon atoms include linear, branched, or cyclic monohydric alcohols such as 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, and benzyl alcohol. Among these, 1-hexanol, 2-hexanol, 2-heptanol, and 4-methyl-2-pentanol are preferable.

The rinse agent may include one or more types of each component. The water content in the rinse agent is preferably 10 mass % or less, more preferably 5 mass % or less, and particularly preferably 3 mass % or less. When the water content in the rinse agent is 10 mass % or less, excellent developability can be obtained. Note that a surfactant may be added to the rinse agent.

Examples of the rinse method include a spin application method that applies the rinse agent to the substrate that is rotated at a constant speed, a dipping method that immerses the substrate in a container filled with the rinse agent for a given time, a spray method that sprays the rinse agent onto the surface of the substrate, and the like.

EXAMPLES

The invention is further described below by way of examples. Note that the invention is not limited to the following examples.

The Mw and the Mn of the polymer were determined under the following conditions using GPC columns manufactured by Tosoh Corporation (G2000HXL×2, G3000HXL×1, G4000HXL×1).

Column temperature: 40° C.

Eluant: tetrahydrofuran (manufactured by Wako Pure Chemical Industries, Ltd.)

Flow rate: 1.0 ml/min

Sample concentration: 1.0 mass %

Sample injection amount: 100 μl

Detector: differential refractometer

Standard: monodisperse polystyrene $^{13}$C-NMR analysis was performed using a nuclear magnetic resonance spectrometer ("JNM-EX270" manufactured by JEOL Ltd.).

Synthesis of Polymer [A]

The following monomers were used to synthesize the polymer [A] and the fluorine-containing polymer [B].

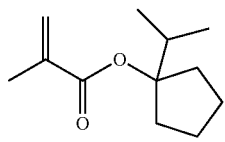

(M-1)

(M-2) 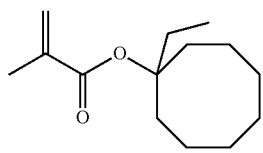

(M-3) 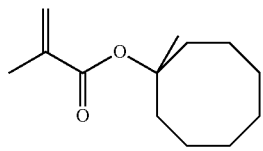

(M-4) 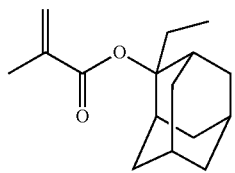

(M-5) 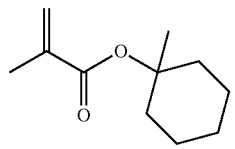

(M-6) 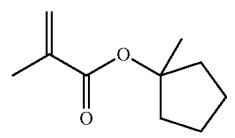

(M-7) 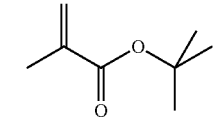

(M-8) 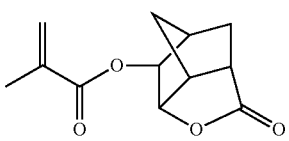

(M-9) 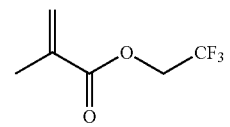

(M-10) 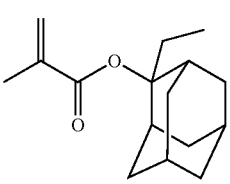

(M-11) 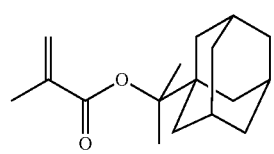

(M-12) 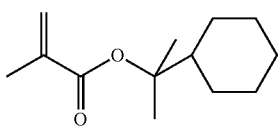

(M-13) 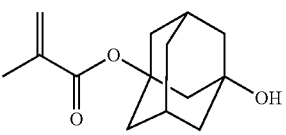

(M-14) 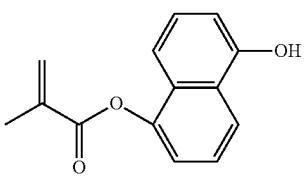

(M-15) 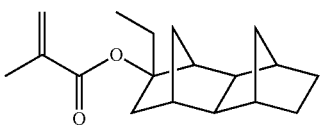

(M-16) 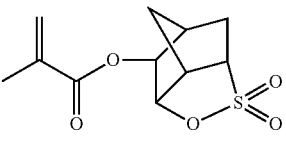

(M-17) 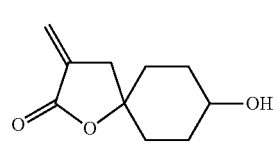

Synthesis Example 1

14.1 g (50 mol %) of the compound (M-1) and 15.9 g (50 mol %) of the compound (M-8) were dissolved in 60 g of methyl ethyl ketone, and 1.2 g (5 mol %) of AIBN was added to the solution to prepare a monomer solution. A three-necked flask (500 ml) was charged with 30 g of methyl ethyl ketone, purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less. The cooled polymer solution was added to 600 g of methanol, and a white powder that precipitated by this operation was filtered off. The white powder was then washed twice with 120 g of methanol in a slurry state, filtered off, and dried at 50° C. for 17 hours to obtain a white powdery polymer (A-1) (25.4 g, yield: 84.5%). The polymer (A-1) had an Mw of 6900 and a dispersity (Mw/Mn) of 1.4. The ratio of the content of structural units derived from the compound (M-1) to the content of structural units derived from the compound (M-8) in the polymer (A-1) (determined by $^{13}$C-NMR analysis) was 47.5:52.5 (mol %).

Synthesis Examples 2 to 10

Polymers (A-2) to (A-10) were obtained in the same manner as in Synthesis Example 1, except that the monomers shown in Table 1 were used in the amounts shown in Table 1. The Mw, the dispersity (Mw/Mn), and the yield (%) of each polymer, and the content of structural units derived from each monomer in each polymer are also shown in Table 1.

TABLE 1

| | | Monomer | | | | |
|---|---|---|---|---|---|---|
| | Polymer | Type | Amount (mol %) | Content (mol %) | Yield (%) | Mw | Mw/Mn |
| Synthesis Example 1 | (A-1) | M-1<br>M-8 | 50<br>50 | 47.5<br>52.5 | 84.5 | 6900 | 1.40 |
| Synthesis Example 2 | (A-2) | M-2<br>M-8 | 50<br>50 | 46.2<br>53.8 | 84.3 | 4200 | 1.39 |
| Synthesis Example 3 | (A-3) | M-3<br>M-8 | 50<br>50 | 47.0<br>53.0 | 82.4 | 4300 | 1.41 |
| Synthesis Example 4 | (A-4) | M-4<br>M-8 | 50<br>50 | 47.1<br>52.9 | 79.8 | 4300 | 1.42 |
| Synthesis Example 5 | (A-5) | M-7<br>M-8 | 50<br>50 | 47.8<br>52.2 | 86.2 | 6700 | 1.58 |
| Synthesis Example 6 | (A-6) | M-10<br>M-8 | 50<br>50 | 47.5<br>52.5 | 86.5 | 4700 | 1.55 |
| Synthesis Example 7 | (A-7) | M-1<br>M-13<br>M-8 | 40<br>10<br>50 | 37.5<br>10.5<br>52.0 | 82.7 | 7000 | 1.42 |
| Synthesis Example 8 | (A-8) | M-2<br>M-14<br>M-16 | 40<br>20<br>40 | 37.0<br>19.5<br>43.5 | 79.8 | 5100 | 1.45 |
| Synthesis Example 9 | (A-9) | M-15<br>M-13<br>M-16 | 45<br>15<br>40 | 43.5<br>15.0<br>41.5 | 80.1 | 5200 | 1.48 |
| Synthesis Example 10 | (A-10) | M-1<br>M-13<br>M-17 | 40<br>20<br>40 | 39.5<br>19.5<br>41.0 | 83.3 | 6200 | 1.43 |
| Synthesis Example 11 | (B-1) | M-5<br>M-9 | 70<br>30 | 70.2<br>29.8 | 76.0 | 7000 | 1.40 |
| Synthesis Example 12 | (B-2) | M-6<br>M-9 | 70<br>30 | 70.4<br>29.6 | 77.1 | 6500 | 1.41 |
| Synthesis Example 13 | (B-3) | M-12<br>M-9 | 70<br>30 | 69.9<br>31.1 | 74.4 | 6600 | 1.45 |
| Synthesis Example 14 | (B-4) | M-11<br>M-9 | 70<br>30 | 68.5<br>31.5 | 72.2 | 6000 | 1.47 |
| Synthesis Example 15 | (b-1) | M-1<br>M-9 | 70<br>30 | 70.1<br>29.9 | 77.3 | 6100 | 1.43 |

Synthesis of Polymer [B]

Synthesis Example 11

35.8 g (70 mol %) of the compound (M-5) and 14.2 g (30 mol %) of the compound (M-9) were dissolved in 100 g of methyl ethyl ketone, and 2.3 g of dimethyl 2,2'-azobisisobutyrate was added to the solution to prepare a monomer solution. A three-necked flask (500 ml) was charged with 50 g of 2-butanone, purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and washed with 825 g of a methanol/2-butanone/hexane (=2/1/8) mixed solution. The solvent was then replaced with propylene glycol methyl ether acetate to obtain a solution of a copolymer (B-1) (38.0 g (based on solid content), yield: 76%). The copolymer (B-1) had an Mw of 7000 and a dispersity (Mw/Mn) of 1.40. The ratio of the content of structural units derived from the compound (M-5) to the content of structural units derived from the compound (M-9) in the copolymer (B-1) (determined by $^{13}$C-NMR analysis) was 70.2:29.8 (mol %).

Synthesis Examples 12 to 15

Polymers (B-2) to (B-4) and (b-1) were obtained in the same manner as in Synthesis Example 11, except that the monomers shown in Table 1 were used in the amounts shown in Table 1. The Mw, the dispersity (Mw/Mn), and the yield (%) of each polymer, and the content of structural units derived from each monomer in each polymer are also shown in Table 1.

Preparation of Photoresist Composition

The acid generator [C], the nitrogen-containing compound [D], and the solvent [E] used to prepare the photoresist composition are shown below.

Acid Generator [C]

(C-1) to (C-3): compounds represented by the following formulas

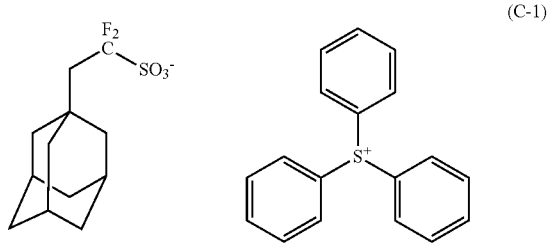
(C-1)

(C-2)

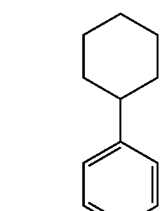

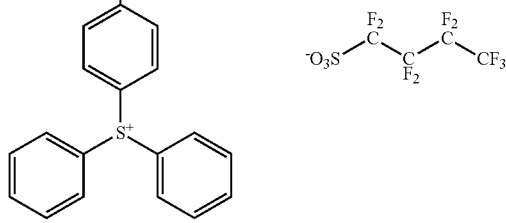

-continued

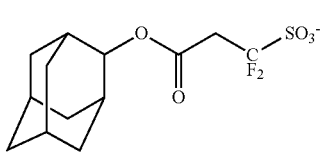
(C-3)

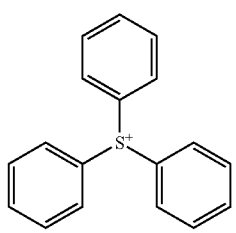
(D-3)

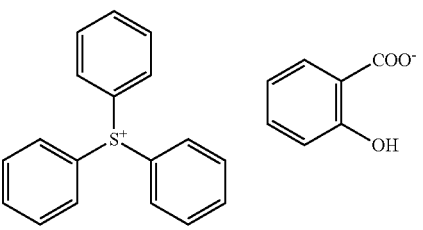

Solvent [E]
(E-1): propylene glycol monomethyl ether acetate
(E-2): cyclohexanone
(E-3): γ-butyrolactone Nitrogen-Containing Compound [D]

(D-1) to (D-3): compounds represented by the following formulas

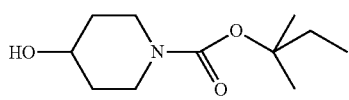
(D-1)

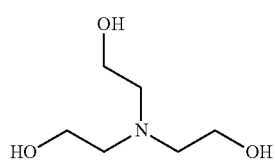
(D-2)

Example 1

100 parts by mass of the polymer (A-1), 3 parts by mass of the polymer (B-1), 9.8 parts by mass of the acid generator (C-1), 1.8 parts by mass of the nitrogen-containing compound (D-1), 2220 parts by mass of the solvent (E-1), 950 parts by mass of the solvent (E-2), and 30 parts by mass of the solvent (E-3) were mixed. The resulting solution was filtered through a filter having a pore size of 0.2 μm to obtain a photoresist composition.

Examples 2 to 25 and Comparative Example 1

A photoresist composition was prepared in the same manner as in Example 1, except that the type and the amount of each component were changed as shown in Table 2.

TABLE 2

| | Polymer [A] | | Component [B] | | Acid generator [C] | | Nitrogen-containing compound [D] | |
|---|---|---|---|---|---|---|---|---|
| | type | Amount (parts by mass) | type | Amount (parts by mass) | type | Amount (parts by mass) | type | Amount (parts by mass) |
| Example 1 | A-1 | 100 | B-1 | 3 | C-1 | 9.8 | D-1 | 1.8 |
| Example 2 | A-2 | 100 | B-1 | 3 | C-1 | 9.8 | D-1 | 1.8 |
| Example 3 | A-3 | 100 | B-1 | 3 | C-1 | 9.8 | D-1 | 1.8 |
| Example 4 | A-4 | 100 | B-1 | 3 | C-1 | 9.8 | D-1 | 1.8 |
| Example 5 | A-1 | 100 | B-2 | 3 | C-1 | 9.8 | D-1 | 1.8 |
| Example 6 | A-2 | 100 | B-2 | 3 | C-1 | 9.8 | D-1 | 1.8 |
| Example 7 | A-3 | 100 | B-2 | 3 | C-1 | 9.8 | D-1 | 1.8 |
| Example 8 | A-4 | 100 | B-2 | 3 | C-1 | 9.8 | D-1 | 1.8 |
| Example 9 | A-6 | 100 | B-2 | 3 | C-1 | 9.8 | D-1 | 1.8 |
| Example 10 | A-1 | 100 | B-3 | 3 | C-1 | 9.8 | D-1 | 1.8 |
| Example 11 | A-2 | 100 | B-3 | 3 | C-1 | 9.8 | D-1 | 1.8 |
| Example 12 | A-3 | 100 | B-3 | 3 | C-1 | 9.8 | D-1 | 1.8 |
| Example 13 | A-4 | 100 | B-3 | 3 | C-1 | 9.8 | D-1 | 1.8 |
| Example 14 | A-1 | 100 | B-4 | 3 | C-1 | 9.8 | D-1 | 1.8 |
| Example 15 | A-2 | 100 | B-4 | 3 | C-1 | 9.8 | D-1 | 1.8 |
| Example 16 | A-3 | 100 | B-4 | 3 | C-1 | 9.8 | D-1 | 1.8 |
| Example 17 | A-4 | 100 | B-4 | 3 | C-1 | 9.8 | D-1 | 1.8 |
| Example 18 | A-1 | 100 | B-1 | 3 | C-2 | 11.6 | D-2 | 1.8 |
| Example 19 | A-1 | 100 | B-1 | 3 | C-2 | 9.3 | D-3 | 4.5 |
| Example 20 | A-1 | 100 | B-1 | 3 | C-3 | 10.6 | D-2 | 1.8 |
| Example 21 | A-1 | 100 | B-1 | 3 | C-3 | 8.5 | D-3 | 4.5 |
| Example 22 | A-7 | 100 | B-1 | 3 | C-2 | 11.6 | D-1 | 1.8 |
| Example 23 | A-8 | 100 | B-2 | 3 | C-2 | 9.3 | D-3 | 4.5 |
| Example 24 | A-9 | 100 | B-3 | 3 | C-3 | 10.6 | D-2 | 1.8 |
| Example 25 | A-10 | 100 | B-3 | 3 | C-3 | 10.6 | D-2 | 1.8 |
| Comparative Example 1 | A-5 | 100 | b-1 | 3 | C-1 | 9.8 | D-1 | 1.8 |

Pattern-Forming Method

A silicon wafer on which an underlayer antireflective film ("ARC66" manufactured by BREWER SCIENCE) (thickness: 105 nm) was formed, was used as a substrate. The photoresist composition (prepared in Examples 1 to 25 and Comparative Example 1) was spin-coated onto the substrate using a coater/developer ("CLEAN TRACK ACT 12" manufactured by Tokyo Electron, Ltd.). The applied photoresist composition was prebaked (PB) at 80° C. for 60 seconds on a hot plate to obtain a resist film having a thickness of 0.10 μm. The resist film was subjected to reduced projection exposure via a mask pattern and immersion water using an ArF immersion scanner ("S610C" manufactured by Nikon Corporation) (NA: 1.30). The resist film was then subjected to post-exposure bake (PEB) for 60 seconds at the temperature shown in Table 3, developed at 23° C. for 30 seconds using butyl acetate, rinsed with 4-methyl-2-pentanol for 10 seconds, and dried to form a negative-tone resist pattern. A pattern was also formed in the same manner as described above using methyl n-pentyl ketone (MAK) or anisole as the developer. A dose at which a hole size (diameter) of 0.055 μm was obtained on the wafer by reduced projection exposure was determined to be an optimum dose, and taken as the sensitivity (mJ/cm$^2$). Table 3 shows the results when butyl acetate was used as the developer, Table 4 shows the results when MAK was used as the developer, and Table 5 shows the results when anisole was used as the developer.

The following items were evaluated using the above pattern-forming method. Table 3 shows the evaluation results when butyl acetate was used as the developer, Table 4 shows the evaluation results when MAK was used as the developer, and Table 5 shows the evaluation results when anisole was used as the developer.

Evaluation of Resolution

The resist film was subjected to reduced projection exposure via a dot pattern that was designed so that a pattern having a diameter of 0.055 μm was obtained by reduced projection exposure, and the minimum hole dimension was measured while increasing the dose. A case where the minimum hole dimension was 0.040 μm or less was evaluated as "Acceptable", and a case where the minimum hole dimension was more than 0.040 μm was evaluated as "Unacceptable".

Evaluation of Roughness

A resist film that was formed using the above pattern-forming method was exposed at the optimum dose (sensitivity) shown in Tables 3 to 5 using an ArF immersion scanner ("S610C" manufactured by Nikon Corporation) (NA: 1.30). The resist film was then subjected to PEB for 60 seconds at the temperature shown in Tables 3 to 5, developed at 23° C. for 30 seconds using butyl acetate, MAK, or anisole, rinsed with 4-methyl-2-pentanol for 10 seconds, and dried. The surface roughness of the resist film was measured using an atomic force microscope ("NanoScope IIIa" manufactured by Digital Instrument) (measurement area: 40×40 μm). A case where the roughness value (RMS) was less than 10 nm was evaluated as "Acceptable", and a case where the roughness value (RMS) was 10 nm or more was evaluated as "Unacceptable".

Evaluation of Missing Contact Hole

A resist film that was formed using the above pattern-forming method was exposed at the optimum dose (sensitivity) shown in Tables 3 to 5 using an ArF immersion scanner ("S610C" manufactured by Nikon Corporation) (NA: 1.30) to form a hole pattern having a diameter of 0.055 μm, and the hole pattern was observed using an SEM ("CG4000" manufactured by Hitachi High-Technologies Corporation). A case where all of the nine holes were open was evaluated as "Acceptable", and a case where one or more holes among the nine holes were closed was evaluated as "Unacceptable".

Evaluation of Circularity

A resist film that was formed using the above pattern-forming method was exposed at the optimum dose (sensitivity) shown in Tables 3 to 5 using an ArF immersion scanner ("S610C" manufactured by Nikon Corporation) (NA: 1.30) to form a hole pattern having a diameter of 0.055 μm, and the hole pattern was observed from above using an SEM ("CG4000" manufactured by Hitachi High-Technologies Corporation). The hole diameter was measured at an arbitrary 24 points, and the dispersion (3sigma) of the hole diameter was evaluated. A case where the dispersion (3sigma) was 0.002 μm or less was evaluated as "Acceptable", and a case where the dispersion (3sigma) was more than 0.002 μm was evaluated as "Unacceptable".

Evaluation of Cross-Sectional Shape

A resist film that was formed using the above pattern-forming method was exposed at the optimum dose (sensitivity) shown in Tables 3 to 5 using an ArF immersion scanner ("S610C" manufactured by Nikon Corporation) (NA: 1.30) to form a hole pattern having a diameter of 0.055 μm, and the cross-sectional shape of the hole pattern was observed using an SEM ("CG4000" manufactured by Hitachi High-Technologies Corporation) to measure the line width Lb in the intermediate part of the hole pattern and the line width La in the upper part of the hole pattern. A case where 0.9≤(La/Lb)≤1.1 was satisfied was evaluated as "Acceptable", and a case where 0.9≤(La/Lb)≤1.1 was not satisfied was evaluated as "Unacceptable".

TABLE 3

| Photoresist composition | PB Temp. (° C.) | PB Time (sec) | PEB Temp. (° C.) | PEB Time (sec) | Evaluation (butyl acetate) | | | | | |
|---|---|---|---|---|---|---|---|---|---|---|
| | | | | | Sensitivity (mJ/cm$^2$) | Resolution | Circularity | Cross-sectional shape | Roughness | Missing contact hole |
| Example 1 | 80 | 60 | 85 | 60 | 33 | Acceptable | Acceptable | Acceptable | Acceptable | Acceptable |
| Example 2 | 80 | 60 | 80 | 60 | 36 | Acceptable | Acceptable | Acceptable | Acceptable | Acceptable |
| Example 3 | 80 | 60 | 80 | 60 | 34 | Acceptable | Acceptable | Acceptable | Acceptable | Acceptable |
| Example 4 | 80 | 60 | 85 | 60 | 26 | Acceptable | Acceptable | Acceptable | Acceptable | Acceptable |
| Example 5 | 80 | 60 | 85 | 60 | 34 | Acceptable | Acceptable | Acceptable | Acceptable | Acceptable |
| Example 6 | 80 | 60 | 80 | 60 | 37 | Acceptable | Acceptable | Acceptable | Acceptable | Acceptable |
| Example 7 | 80 | 60 | 80 | 60 | 34 | Acceptable | Acceptable | Acceptable | Acceptable | Acceptable |
| Example 8 | 80 | 60 | 85 | 60 | 27 | Acceptable | Acceptable | Acceptable | Acceptable | Acceptable |
| Example 9 | 80 | 60 | 85 | 60 | 28 | Acceptable | Acceptable | Acceptable | Acceptable | Acceptable |
| Example 10 | 80 | 60 | 85 | 60 | 33 | Acceptable | Acceptable | Acceptable | Acceptable | Acceptable |
| Example 11 | 80 | 60 | 80 | 60 | 36 | Acceptable | Acceptable | Acceptable | Acceptable | Acceptable |

TABLE 3-continued

| | | | | | Evaluation (butyl acetate) | | | | | |
|---|---|---|---|---|---|---|---|---|---|---|
| | PB | | PEB | | | | | Cross- | | Missing |
| Photoresist composition | Temp. (° C.) | Time (sec) | Temp. (° C.) | Time (sec) | Sensitivity (mJ/cm$^2$) | Resolution | Circularity | sectional shape | Roughness | contact hole |
| Example 12 | 80 | 60 | 80 | 60 | 34 | Acceptable | Acceptable | Acceptable | Acceptable | Acceptable |
| Example 13 | 80 | 60 | 85 | 60 | 26 | Acceptable | Acceptable | Acceptable | Acceptable | Acceptable |
| Example 14 | 80 | 60 | 85 | 60 | 33 | Acceptable | Acceptable | Acceptable | Acceptable | Acceptable |
| Example 15 | 80 | 60 | 80 | 60 | 36 | Acceptable | Acceptable | Acceptable | Acceptable | Acceptable |
| Example 16 | 80 | 60 | 80 | 60 | 34 | Acceptable | Acceptable | Acceptable | Acceptable | Acceptable |
| Example 17 | 80 | 60 | 85 | 60 | 26 | Acceptable | Acceptable | Acceptable | Acceptable | Acceptable |
| Example 18 | 80 | 60 | 85 | 60 | 28 | Acceptable | Acceptable | Acceptable | Acceptable | Acceptable |
| Example 19 | 80 | 60 | 85 | 60 | 26 | Acceptable | Acceptable | Acceptable | Acceptable | Acceptable |
| Example 20 | 80 | 60 | 85 | 60 | 30 | Acceptable | Acceptable | Acceptable | Acceptable | Acceptable |
| Example 21 | 80 | 60 | 85 | 60 | 28 | Acceptable | Acceptable | Acceptable | Acceptable | Acceptable |
| Example 22 | 80 | 60 | 85 | 60 | 25 | Acceptable | Acceptable | Acceptable | Acceptable | Acceptable |
| Example 23 | 80 | 60 | 80 | 60 | 26 | Acceptable | Acceptable | Acceptable | Acceptable | Acceptable |
| Example 24 | 80 | 60 | 85 | 60 | 25 | Acceptable | Acceptable | Acceptable | Acceptable | Acceptable |
| Example 25 | 80 | 60 | 85 | 60 | 27 | Acceptable | Acceptable | Acceptable | Acceptable | Acceptable |
| Comparative Example 1 | 80 | 60 | 110 | 60 | 26 | Unacceptable | Unacceptable | Unacceptable | Unacceptable | Unacceptable |

TABLE 4

| | | | | | Evaluation (MAK) | | | | | |
|---|---|---|---|---|---|---|---|---|---|---|
| | PB | | PEB | | | | | Cross- | | Missing |
| Photoresist composition | Temp. (° C.) | Time (sec) | Temp. (° C.) | Time (sec) | Sensitivity (mJ/cm$^2$) | Resolution | Circularity | sectional shape | Roughness | contact hole |
| Example 1 | 80 | 60 | 85 | 60 | 57 | Acceptable | Acceptable | Acceptable | Acceptable | Acceptable |
| Example 2 | 80 | 60 | 80 | 60 | 62 | Acceptable | Acceptable | Acceptable | Acceptable | Acceptable |
| Example 3 | 80 | 60 | 80 | 60 | 59 | Acceptable | Acceptable | Acceptable | Acceptable | Acceptable |
| Example 4 | 80 | 60 | 85 | 60 | 45 | Acceptable | Acceptable | Acceptable | Acceptable | Acceptable |
| Example 5 | 80 | 60 | 85 | 60 | 59 | Acceptable | Acceptable | Acceptable | Acceptable | Acceptable |
| Example 6 | 80 | 60 | 80 | 60 | 64 | Acceptable | Acceptable | Acceptable | Acceptable | Acceptable |
| Example 7 | 80 | 60 | 80 | 60 | 59 | Acceptable | Acceptable | Acceptable | Acceptable | Acceptable |
| Example 8 | 80 | 60 | 85 | 60 | 47 | Acceptable | Acceptable | Acceptable | Acceptable | Acceptable |
| Example 9 | 80 | 60 | 85 | 60 | 48 | Acceptable | Acceptable | Acceptable | Acceptable | Acceptable |
| Example 10 | 80 | 60 | 85 | 60 | 57 | Acceptable | Acceptable | Acceptable | Acceptable | Acceptable |
| Example 11 | 80 | 60 | 80 | 60 | 62 | Acceptable | Acceptable | Acceptable | Acceptable | Acceptable |
| Example 12 | 80 | 60 | 80 | 60 | 59 | Acceptable | Acceptable | Acceptable | Acceptable | Acceptable |
| Example 13 | 80 | 60 | 85 | 60 | 45 | Acceptable | Acceptable | Acceptable | Acceptable | Acceptable |
| Example 14 | 80 | 60 | 85 | 60 | 57 | Acceptable | Acceptable | Acceptable | Acceptable | Acceptable |
| Example 15 | 80 | 60 | 80 | 60 | 62 | Acceptable | Acceptable | Acceptable | Acceptable | Acceptable |
| Example 16 | 80 | 60 | 80 | 60 | 59 | Acceptable | Acceptable | Acceptable | Acceptable | Acceptable |
| Example 17 | 80 | 60 | 85 | 60 | 45 | Acceptable | Acceptable | Acceptable | Acceptable | Acceptable |
| Example 18 | 80 | 60 | 85 | 60 | 48 | Acceptable | Acceptable | Acceptable | Acceptable | Acceptable |
| Example 19 | 80 | 60 | 85 | 60 | 45 | Acceptable | Acceptable | Acceptable | Acceptable | Acceptable |
| Example 20 | 80 | 60 | 85 | 60 | 52 | Acceptable | Acceptable | Acceptable | Acceptable | Acceptable |
| Example 21 | 80 | 60 | 85 | 60 | 49 | Acceptable | Acceptable | Acceptable | Acceptable | Acceptable |
| Example 22 | 80 | 60 | 85 | 60 | 43 | Acceptable | Acceptable | Acceptable | Acceptable | Acceptable |
| Example 23 | 80 | 60 | 80 | 60 | 45 | Acceptable | Acceptable | Acceptable | Acceptable | Acceptable |
| Example 24 | 80 | 60 | 85 | 60 | 43 | Acceptable | Acceptable | Acceptable | Acceptable | Acceptable |
| Example 25 | 80 | 60 | 85 | 60 | 47 | Acceptable | Acceptable | Acceptable | Acceptable | Acceptable |
| Comparative Example 1 | 80 | 60 | 110 | 60 | 45 | Unacceptable | Unacceptable | Unacceptable | Unacceptable | Unacceptable |

TABLE 5

| | | | | | Evaluation (anisole) | | | | | |
|---|---|---|---|---|---|---|---|---|---|---|
| | PB | | PEB | | | | | Cross- | | Missing |
| Photoresist composition | Temp. (° C.) | Time (sec) | Temp. (° C.) | Time (sec) | Sensitivity (mJ/cm$^2$) | Resolution | Circularity | sectional shape | Roughness | contact hole |
| Example 1 | 80 | 60 | 85 | 60 | 45 | Acceptable | Acceptable | Acceptable | Acceptable | Acceptable |
| Example 2 | 80 | 60 | 80 | 60 | 50 | Acceptable | Acceptable | Acceptable | Acceptable | Acceptable |
| Example 3 | 80 | 60 | 80 | 60 | 47 | Acceptable | Acceptable | Acceptable | Acceptable | Acceptable |
| Example 4 | 80 | 60 | 85 | 60 | 36 | Acceptable | Acceptable | Acceptable | Acceptable | Acceptable |
| Example 5 | 80 | 60 | 85 | 60 | 47 | Acceptable | Acceptable | Acceptable | Acceptable | Acceptable |

TABLE 5-continued

| Photoresist composition | PB Temp. (°C.) | PB Time (sec) | PEB Temp. (°C.) | PEB Time (sec) | Evaluation (anisole) | | | | | |
|---|---|---|---|---|---|---|---|---|---|---|
| | | | | | Sensitivity (mJ/cm$^2$) | Resolution | Circularity | Cross-sectional shape | Roughness | Missing contact hole |
| Example 6 | 80 | 60 | 80 | 60 | 51 | Acceptable | Acceptable | Acceptable | Acceptable | Acceptable |
| Example 7 | 80 | 60 | 80 | 60 | 47 | Acceptable | Acceptable | Acceptable | Acceptable | Acceptable |
| Example 8 | 80 | 60 | 85 | 60 | 37 | Acceptable | Acceptable | Acceptable | Acceptable | Acceptable |
| Example 9 | 80 | 60 | 85 | 60 | 39 | Acceptable | Acceptable | Acceptable | Acceptable | Acceptable |
| Example 10 | 80 | 60 | 85 | 60 | 45 | Acceptable | Acceptable | Acceptable | Acceptable | Acceptable |
| Example 11 | 80 | 60 | 80 | 60 | 50 | Acceptable | Acceptable | Acceptable | Acceptable | Acceptable |
| Example 12 | 80 | 60 | 80 | 60 | 47 | Acceptable | Acceptable | Acceptable | Acceptable | Acceptable |
| Example 13 | 80 | 60 | 85 | 60 | 36 | Acceptable | Acceptable | Acceptable | Acceptable | Acceptable |
| Example 14 | 80 | 60 | 85 | 60 | 45 | Acceptable | Acceptable | Acceptable | Acceptable | Acceptable |
| Example 15 | 80 | 60 | 80 | 60 | 50 | Acceptable | Acceptable | Acceptable | Acceptable | Acceptable |
| Example 16 | 80 | 60 | 80 | 60 | 47 | Acceptable | Acceptable | Acceptable | Acceptable | Acceptable |
| Example 17 | 80 | 60 | 85 | 60 | 36 | Acceptable | Acceptable | Acceptable | Acceptable | Acceptable |
| Example 18 | 80 | 60 | 85 | 60 | 38 | Acceptable | Acceptable | Acceptable | Acceptable | Acceptable |
| Example 19 | 80 | 60 | 85 | 60 | 35 | Acceptable | Acceptable | Acceptable | Acceptable | Acceptable |
| Example 20 | 80 | 60 | 85 | 60 | 41 | Acceptable | Acceptable | Acceptable | Acceptable | Acceptable |
| Example 21 | 80 | 60 | 85 | 60 | 38 | Acceptable | Acceptable | Acceptable | Acceptable | Acceptable |
| Example 22 | 80 | 60 | 85 | 60 | 34 | Acceptable | Acceptable | Acceptable | Acceptable | Acceptable |
| Example 23 | 80 | 60 | 80 | 60 | 35 | Acceptable | Acceptable | Acceptable | Acceptable | Acceptable |
| Example 24 | 80 | 60 | 85 | 60 | 34 | Acceptable | Acceptable | Acceptable | Acceptable | Acceptable |
| Example 25 | 80 | 60 | 85 | 60 | 37 | Acceptable | Acceptable | Acceptable | Acceptable | Acceptable |
| Comparative Example 1 | 80 | 60 | 110 | 60 | 36 | Unacceptable | Unacceptable | Unacceptable | Unacceptable | Unacceptable |

As is clear from the results shown in Tables 3 to 5, the photoresist compositions according to the embodiments of the invention could form a pattern that exhibited excellent lithographic performance (e.g., resolution and circularity) while suppressing occurrence of a missing contact hole and roughness on the surface of the exposed area after development. It was confirmed that the above effects were achieved when using butyl acetate as the developer, when using methyl n-pentyl ketone as the developer, and when using anisole as the developer.

The photoresist composition according to the embodiments of the invention may be used for a pattern-forming method that utilizes an organic solvent as the developer, and exhibits excellent lithographic performance (e.g., resolution and circularity) while suppressing occurrence of a missing contact hole and roughness on the surface of the exposed area after development. Therefore, the photoresist composition is sufficient to meet the demands of various electronic device (e.g., semiconductor device or liquid crystal device) structures that are expected to be further miniaturized in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
providing a resist film on a substrate using a photoresist composition;
exposing the resist film; and
developing the exposed resist film using a developer having an organic solvent content of 80 mass % or more, the photoresist composition comprising:
a first polymer that is a base polymer and comprises a first structural unit that comprises an acid-labile group;
a second polymer that comprises a second structural unit that comprises an acid-labile group, and has a fluorine atom content higher than a fluorine atom content of the first polymer; and
an acid generator,
the first structural unit being represented by formula (3) or a formula (4),
the second structural unit being represented by formula (1) or a formula (2),

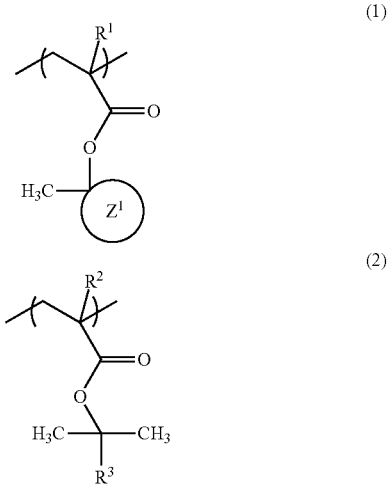

wherein
$R^1$ is a hydrogen atom, a fluorine atom, a methyl group, or a trifluoromethyl group,
$Z^1$ is a divalent monocyclic hydrocarbon group having 5 or 6 carbon atoms or a divalent polycyclic hydrocarbon group having 7 to 10 carbon atoms,
$R^2$ is a hydrogen atom, a fluorine atom, a methyl group, or a trifluoromethyl group, and
$R^3$ is an alicyclic hydrocarbon group having 5 to 20 carbon atoms,

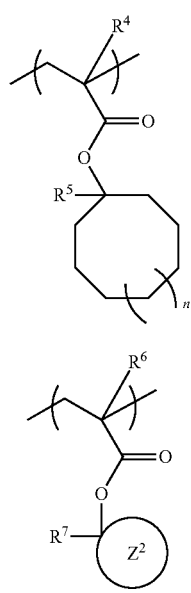

wherein
R⁴ is a hydrogen atom, a fluorine atom, a methyl group, or a trifluoromethyl group,
R⁵ is an alkyl group having 1 to 5 carbon atoms,
n is 0 or 1,
R⁶ is a hydrogen atom, a fluorine atom, a methyl group, or a trifluoromethyl group,
R⁷ is an alkyl group having 2 to 5 carbon atoms, and
Z² is a divalent monocyclic hydrocarbon group having 5 or 6 carbon atoms or a divalent polycyclic hydrocarbon group having 7 to 15 carbon atoms,
wherein a content of the second polymer is 0.5 to 10 parts by mass based on 100 parts by mass of the first polymer.

2. The pattern-forming method according to claim 1, wherein the second polymer further comprises a third structural unit represented by formula (5),

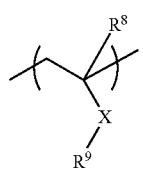

wherein
R⁸ is a hydrogen atom, a fluorine atom, a methyl group, or a trifluoromethyl group,
X is a linking group, and
R⁹ is a linear or branched alkyl group having 1 to 10 carbon atoms or an alicyclic hydrocarbon group having 4 to 20 carbon atoms, wherein some or all of the hydrogen atoms of the alkyl group or the alicyclic hydrocarbon group represented by R⁹ are substituted with a substituent, at least one substituent that substitutes some or all of the hydrogen atoms of the alkyl group or the alicyclic hydrocarbon group represented by R⁹ being a fluorine atom.

3. The pattern-forming method according to claim 2, wherein a content of the third structural unit in the second polymer is from 20 to 50 mol % based on total structural units included in the second polymer.

4. The pattern-forming method according to claim 2, wherein in the formula (5), X represents a single bond, an oxygen atom, a sulfur atom, an ester group, an amide group, a sulfonylamide group, or a urethane group.

5. The pattern-forming method according to claim 1, wherein in the formula (4), R⁷ represents an ethyl group or a propyl group.

6. The pattern-forming method according to claim 1, wherein in the formula (4), Z² represents a cyclopentanediyl group, a cyclohexanediyl group, or an adamantanediyl group.

7. The pattern-forming method according to claim 1, wherein a content of the first structural unit in the first polymer is from 10 to 90 mol % based on total structural units included in the first polymer.

8. The pattern-forming method according to claim 1, wherein a content of the first structural unit in the first polymer is from 30 to 60 mol % based on total structural units included in the first polymer.

9. The pattern-forming method according to claim 1, wherein the first polymer further comprises a structural unit that comprises a lactone structure, a sultone structure, or a cyclic carbonate structure.

10. The pattern-forming method according to claim 8, wherein a content of the structural unit that comprises a lactone structure, a sultone structure, or a cyclic carbonate structure in the first polymer is from 30 to 60 mol % based on total structural units included in the first polymer.

11. The pattern-forming method according to claim 1, wherein the first polymer further comprises a structural unit that comprises a polar group.

12. The pattern-forming method according to claim 11, wherein a content of the structural unit that comprises a polar group in the first polymer is from 10 to 40 mol % based on total structural units included in the first polymer.

13. The pattern-forming method according to claim 1, wherein a content of the second structural unit in the second polymer is from 10 to 95 mol % based on total structural units included in the second polymer.

14. The pattern-forming method according to claim 1, wherein a content of the second structural unit in the second polymer is from 40 to 85 mol % based on total structural units included in the second polymer.

15. The pattern-forming method according to claim 1, wherein an amount of the second polymer is 1 to 10 parts by mass based on 100 parts by mass of the first polymer.

16. The pattern-forming method according to claim 1, wherein an amount of the second polymer is 1 to 8 parts by mass based on 100 parts by mass of the first polymer.

* * * * *